United States Patent
Choi et al.

(10) Patent No.: US 7,502,251 B2
(45) Date of Patent: *Mar. 10, 2009

(54) PHASE-CHANGE MEMORY DEVICE AND METHOD OF WRITING A PHASE-CHANGE MEMORY DEVICE

(75) Inventors: Byung-Gil Choi, Yongin-si (KR); Choong-Keun Kwak, Suwon-si (KR); Du-Eung Kim, Yongin-Si (KR); Beak-Hyung Cho, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

This patent is subject to a terminal disclaimer.

(21) Appl. No.: 11/502,563

(22) Filed: Aug. 11, 2006

(65) Prior Publication Data

US 2006/0274574 A1  Dec. 7, 2006

Related U.S. Application Data

(63) Continuation-in-part of application No. 10/919,371, filed on Aug. 17, 2004, now Pat. No. 7,110,286.

(51) Int. Cl.
*G11C 11/00* (2006.01)

(52) U.S. Cl. ..................................... 365/163

(58) Field of Classification Search ................... 365/163
See application file for complete search history.

(56) References Cited

U.S. PATENT DOCUMENTS

| | | | |
|---|---|---|---|
| 6,480,438 B1 | 11/2002 | Park | |
| 6,625,054 B2 * | 9/2003 | Lowrey et al. | ............... 365/148 |
| 6,813,177 B2 | 11/2004 | Lowrey et al. | |
| 6,937,507 B2 | 8/2005 | Chen | |
| 7,110,286 B2 | 9/2006 | Choi et al. | |

* cited by examiner

*Primary Examiner*—VanThu Nguyen
(74) *Attorney, Agent, or Firm*—Volentine & Whitt, PLLC

(57) ABSTRACT

A phase-change cell memory device includes a plurality of phase-change memory cells, an address circuit, a write driver, and a write driver control circuit. The phase-change memory cells each include a volume of material that is programmable between amorphous and crystalline states. The address circuit selects at least one of the memory cells, and the write driver generates a reset pulse current to program a memory cell selected by the address circuit into the amorphous state, and a set pulse current to program the memory cell selected by the address circuit into the crystalline state. The write driver control circuit varies at least one of a pulse width and a pulse count of at least one of the reset and set pulse currents according to a load between the write driver and the memory cell selected by the address circuit.

24 Claims, 36 Drawing Sheets

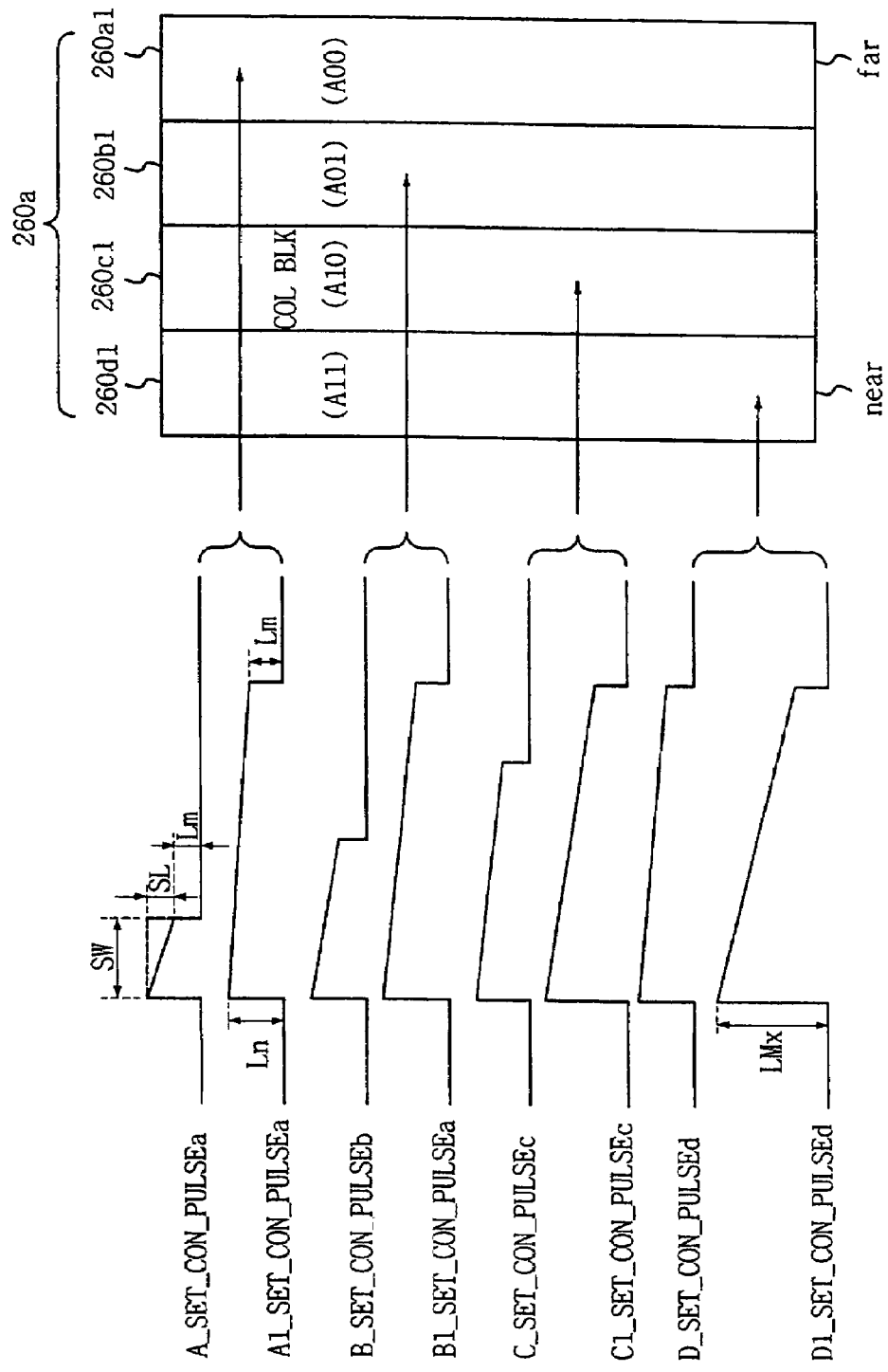

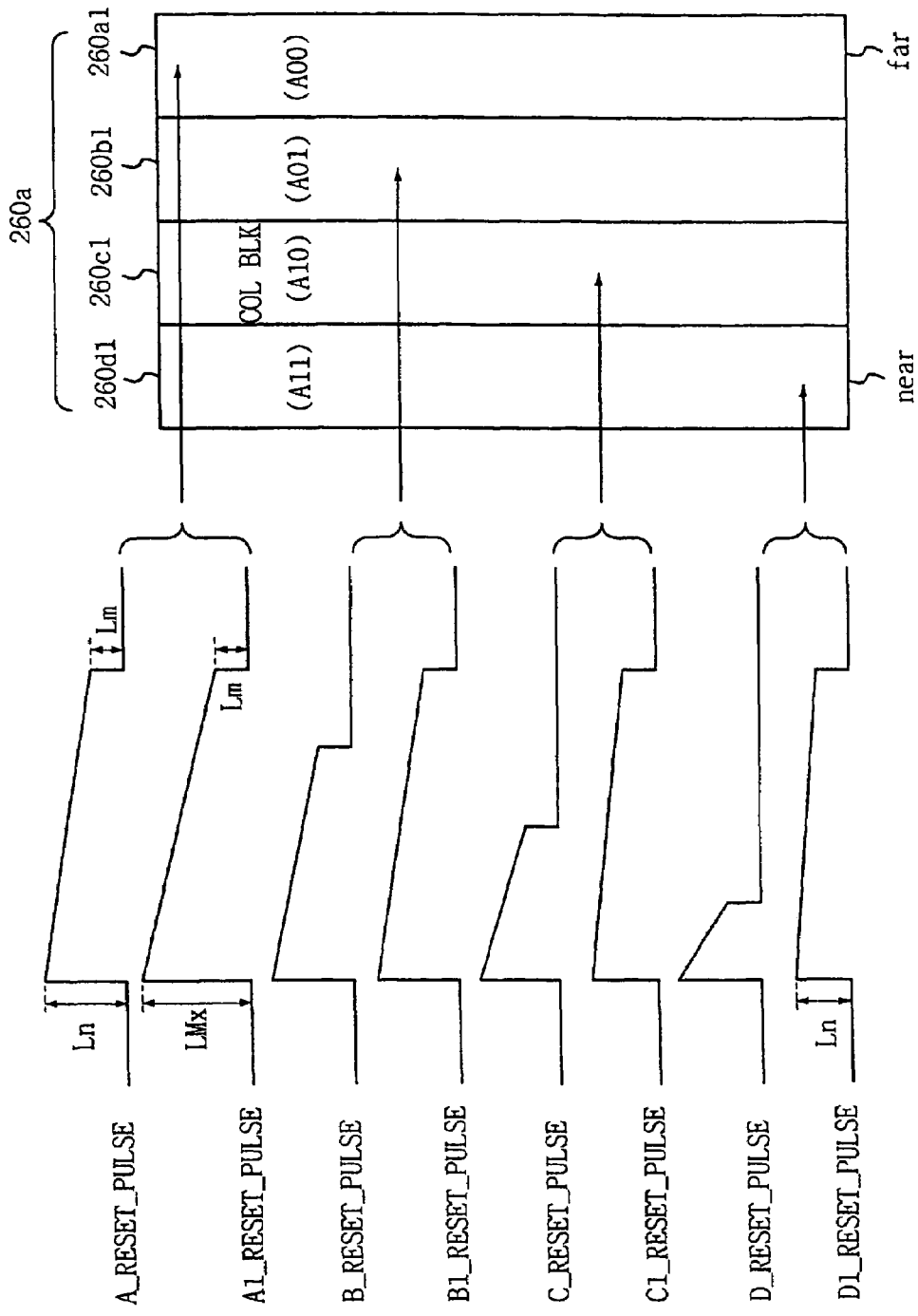

PHASE-CHANGE MEMORY DEVICE AND METHOD OF WRITING A PHASE-CHANGE MEMORY DEVICE

CROSS-REFERENCE TO RELATED APPLICATION(S)

This is a Continuation-In-Part of U.S. non-provisional application Ser. No. 10/919,371, filed Aug. 17, 2004 now U.S. Pat. No. 7,110,286, the contents of which are incorporated herein by reference.

BACKGROUND OF THE INVENTION

1. Field of the Invention

The present invention generally relates to phase-change memory devices and methods for writing phase-change memory cells. More particularly, the present invention relates to phase-change memory devices and methods of writing phase-change memory devices in which write current pulse characteristics are varied according to a load of a phase-change cell to be written.

2. Description of the Related Art

Phase change memory cell devices rely on phase change materials, such as chalcogenide, which are capable of stably transitioning between amorphous and crystalline phases. The differing resistance values exhibited by the two phases are used to distinguish logic values of the memory cells. That is, an amorphous state exhibits a relatively high resistance, and a crystalline state exhibits a relatively low resistance.

FIG. 1 illustrates a phase-change memory cell in an amorphous state 52-1 and in a crystalline state 52-2. The phase-change memory cell may be part of a Phase-change Random Access Memory (PRAM). The phase-change memory cell 52 includes a phase-change layer 55 between a bottom electrode (BE) 54 and an upper electrode (UE) 56. The phase-change layer 55 is formed of a phase-change material, such as a chalcogenide alloy (GST). A bit line (BL) is coupled to the upper electrode 56. The bottom electrode 54 is coupled to ground through transistor NT. A word line (WL) is coupled to the gate of transistor NT.

When phase-change memory cell 52 is in an amorphous state 52-1, a portion of the phase-change layer 55 is amorphous. Likewise, when phase-change memory cell 52 is in a crystalline state 52-2, the portion of the phase-change layer 55 is crystalline. As shown by the equivalent circuit diagram in FIG. 1, the phase-change material layer 55 is SET (ST1) to the crystalline state or RESET (ST2) to the amorphous state depending on an electrical current applied via the bit line BL.

As would be appreciated by one skilled in the art, the terms "amorphous state" and "crystalline state" are not absolute characterizations of the phase-change material. Rather, when a portion of the phase-change material is said to be in an amorphous state (i.e. a RESET state), this means that the material is sufficiently amorphous to take on a resistive value R1 which may be readily distinguished from a resistive value R2 of the material in the crystalline state (SET state).

Conversely, when a portion of the phase-change material is said to be in a crystalline state (SET state), this means that the material is sufficiently crystalline to take on a resistive value which may be readily distinguished from the resistive value of the material in the amorphous state (RESET state).

FIG. 2 illustrates the temperature characteristics of a phase-change memory cell in a set programming operation and a reset programming operation. A set programming operation causes a phase-change material layer of a phase-change memory cell to crystallize, thus decreasing the resistivity of the phase-change material layer. Likewise, a reset programming operation causes a phase-change material layer of a phase-change memory cell to become amorphous, thus increasing the resistivity of the phase-change material layer.

As illustrated in FIG. 2, the programming of a phase-change memory cell is dependent on the temperature of the phase-change memory cell. An amorphizing (RESET) temperature pulse includes a rising portion 12, a peak portion 10, and a declining portion 14. In order to reset a phase-change memory cell, using an amorphizing (RESET) pulse, the phase change material layer is heated above its melting point (Tm) by a resistive heater for a relatively short period of time. Between time T0 and time T1, the temperature of the phase-change material layer is rapidly increased to a temperature above the melting point (Tm) of the phase-change material layer. During the declining portion 14, the phase-change material layer is rapidly cooled, thus causing the phase-change material layer to become relatively amorphous. In other words, raising the temperature of the phase-change material layer above its melting point (Tm) causes crystal structures in the phase-change material to be broken apart. Because the phase-change material layer is cooled rapidly, there is little opportunity for crystals to form in the phase-change material layer before the phase-change material layer becomes solid in a relatively amorphous state.

Likewise, a crystallizing (SET) temperature pulse includes a rising portion 22, a peak portion 20, and a declining portion 24. In order to set a phase-change memory cell, using a crystallizing (SET) pulse, the phase change material layer is heated above its crystallization point (Tx) by a resistive heater for a relatively short period of time (e.g. 50 ns), which is longer than the period of time that the temperature is raised during a amorphizing (RESET) temperature pulse. Between time T0 and time T2, the temperature of the phase-change material layer is rapidly increased to above the crystallization point (Tx) of the phase-change material layer and crystallization occurs. During the declining portion 24, the phase-change material layer is rapidly cooled, thus causing the phase-change material layer to set in a relatively crystalline state.

FIG. 3 comparatively illustrates the RESET current pulse G1 and the SET current pulse G2. The RESET current pulse G1, which is a relatively short pulse of magnitude I-RESET, causes the temperature of the phase-change material to RESET the material into an amorphous state as shown above in FIG. 2. The SET current pulse G2, which is a relatively long pulse of magnitude I-SET (where I-SET is less than I-RESET), causes the temperature of the phase-change material to SET the material into crystalline state as shown above in FIG. 2.

FIG. 4 illustrates a memory 100 having a phase-change memory cell array 160. As shown, the cell array 160 includes a plurality of memory blocks, namely, Block(A00) 160a, Block(A01) 160b, Block(A10) 160c, and Block (A11) 60d. Each memory block includes a plurality phase-change memory cells commonly connected to a word lines WLi, WLj, WLk, and WLl respectively contained in the memory blocks.

Buffers 110_1 and 110_2 receive addressing signals A0 and A1. The address signals A0 and A1 are decoded by a pre-decoder 120 to generate decoded signals A00_DEC, A01_DEC, A10_DEC, and A11_DEC, which in turn are decoded by a main decoder 140 to output block selection signals A00, A01, A10 and A11. The block selection signals A00, A01, A10 and A11 drive word lines WLi, WLj, WLk, and WLl of memory blocks 160a, 160b, 160c, and 160d, respectively.

A write driver 130 outputs a SET or RESET write current pulse SDL according to a programming signal SET(RESET)_CON_PULSE and a data signal DIN from buffer 111. A column decoder 150 then supplies the write current pulse SDL to the memory blocks 160a, 160b, 160c, and 160d.

As illustrated in example FIG. 4, memory block 160d is closer to decoder 150 than memory cell block 160a. Accordingly, different loads are present from decoder 150 to the memory blocks 160a, 160b, 160c, and 160d. These loads are represented in the figure by resistive elements R1, R2, R3 and R4.

The differing loads of the memory blocks 160a, 160b, 160c, and 160d, result in different write conditions of the phase change memory cells of the memory blocks. This is explained with reference to FIGS. 5 through 7.

FIG. 5 is a simplified diagram illustrating the different set programming pulses (e.g. SET_CON_PULSE) applied to the phase-change memory cell blocks 160a, 160b, 160c, and 160d of the memory array 160. As can be seen from FIG. 5, the set programming pulses all have the same pulse width.

FIG. 6 illustrates the RESET resistance distribution regions of the phase-change memory cells in blocks 160a, 160b, 160c, and 160d. As the load of the memory blocks is increased, the resistance distribution region is decreased. In order to avoid write errors, the RESET write current pulse must be capable of writing the highest-load memory block 160a such that the lowest resistance distribution region (Region (A00)) is fully in a RESET region. Since the memory block 160d has the lowest load, a relatively strong RESET write current pulse is applied to memory cells of the memory block 160d. As such, a relatively high crystalline state is achieved which results in a relatively high resistance distribution region (Region (A11)). Conversely, the memory block 160a with the greatest load will exhibit a relatively low resistance distribution region (Region (A00).

FIG. 7 illustrates the SET resistance distribution regions of the phase-change memory cells in blocks 160a, 160b, 160c, and 160d. Again, as the load of the memory blocks is increased, the resistance distribution region is decreased. In order to avoid write errors, the SET write current pulse must be capable of writing the lowest-load memory block 160d such that the highest resistance distribution region (Region (A11)) is fully in a SET region. Otherwise, SET failures will occur in the portion WIN of the distribution region of the nearest block (Region (A11)). Thus, in order to bring the Region (A11) fully into the SET region, the phase-change memory cells of the Region (A00) become "over-programmed". That is, power is unnecessarily expended with regards to the SET programming of the phase-change memory cells associated with Region (A00). Further, additional power is needed to bring the same memory cells back into the RESET region during RESET programming.

SUMMARY OF THE INVENTION

According to an aspect of the present invention, a phase-change cell memory device is provided which includes a plurality of phase-change memory cells each including a volume of material programmable between amorphous and crystalline states, an address circuit for selecting at least one of the memory cells, and a write driver for generating a reset sloped pulse current to program a memory cell selected by the address circuit into the amorphous state, and for generating a set sloped pulse current to program the memory cell selected by the address circuit into the crystalline state. The memory device further includes a write driver control circuit coupled to the address circuit, the write driver control circuit for varying at least one of a pulse width and pulse slope of at least one of the reset and set sloped pulse currents according to a load between the write driver and the memory cell selected by the address circuit.

According to another aspect of the present invention, a phase-change cell memory device is provided which includes a plurality of memory cell blocks each including a plurality of phase-change memory cells, each of the phase-change memory cells having a volume of material programmable between amorphous and crystalline states, an address circuit for selecting each of the memory cell blocks, and a write driver for selectively generating a reset sloped pulse current to program memory cells of a memory cell block selected by the address circuit into the amorphous set state, and a set sloped pulse current to program memory cells of the memory cell block selected by the address circuit into the crystalline state. The memory device further includes a write driver control circuit for varying at least one of a pulse width and a pulse slope of at least one of the reset and set sloped pulse currents according to the memory cell block selected by the address circuit.

According to still another aspect of the present invention, a phase-change cell memory device is provided which includes a phase-change memory cell array including a plurality of word lines and bit lines and a plurality of phase-change cells at respective intersection regions of the word lines and bit lines, the memory cell array being defined by a plurality of memory blocks each including at least one word line, and each of the phase-change memory cells including a volume of material programmable between amorphous and crystalline states. The memory device further includes an address decoder for decoding an input row address to select a word line of each memory block and to select one of the memory blocks, a bit line selection circuit for selecting at least one bit line according to an input column address, and a write driver coupled to the bit line selection circuit, for selectively generating a reset sloped pulse current to program a memory cell at the intersection of a selected bit line and word line within the selected memory cell block into the amorphous set state, and a set sloped pulse current to program a memory cell at the intersection of the selected bit line and word line within the selected memory cell block into the crystalline state. The memory device still further includes a write driver control circuit for varying at least one of a pulse width and a pulse slope of at least one of the reset and set sloped pulse currents according to the memory cell block selected by the address decoder.

According to yet another aspect of the present invention, a method of programming a phase-change memory device having a plurality of phase-change memory cells, the plurality of phase-change memory cells each including a volume of material programmable between amorphous and crystalline states. The method includes using a write driver to selectively generate a reset sloped pulse current to program the memory cells selected by an address circuit into the amorphous set state, and a set sloped pulse current to program the memory cells selected by the address circuit into the crystalline state, and varying at least one of a pulse width and a pulse slope of at least one of the reset and set sloped pulse currents according to a load between the writer driver and the memory cells being programmed.

BRIEF DESCRIPTION OF THE DRAWINGS

The above and other aspects and features of the present invention will become readily apparent from the detailed description that follows, with reference to the accompanying drawings, in which:

FIG. 38 illustrates set programming pulses of a slope pulse type differentially applied per column block of the memory cell array in a write operation of the device shown in FIG. 35; and FIG. 39 illustrates reset programming pulses of a slope pulse type differentially applied per column block of the memory cell array in a write operation of the device shown in FIG. 35.

DETAILED DESCRIPTION OF EMBODIMENTS

The present invention is generally characterized by controlling a write driver of a phase-change memory device such that at least one of a pulse width, a pulse slope and a pulse count of at least one of RESET and SET pulse currents are varied according to a load between the write driver and an addressed memory cell. In this manner, over-programming of memory cells can be avoided, thus reducing the power consumption needed to reliably write the cells into the SET and/or RESET states.

The present invention will now be described in detail by way of several preferred but non-limiting embodiments.

Figure 8:
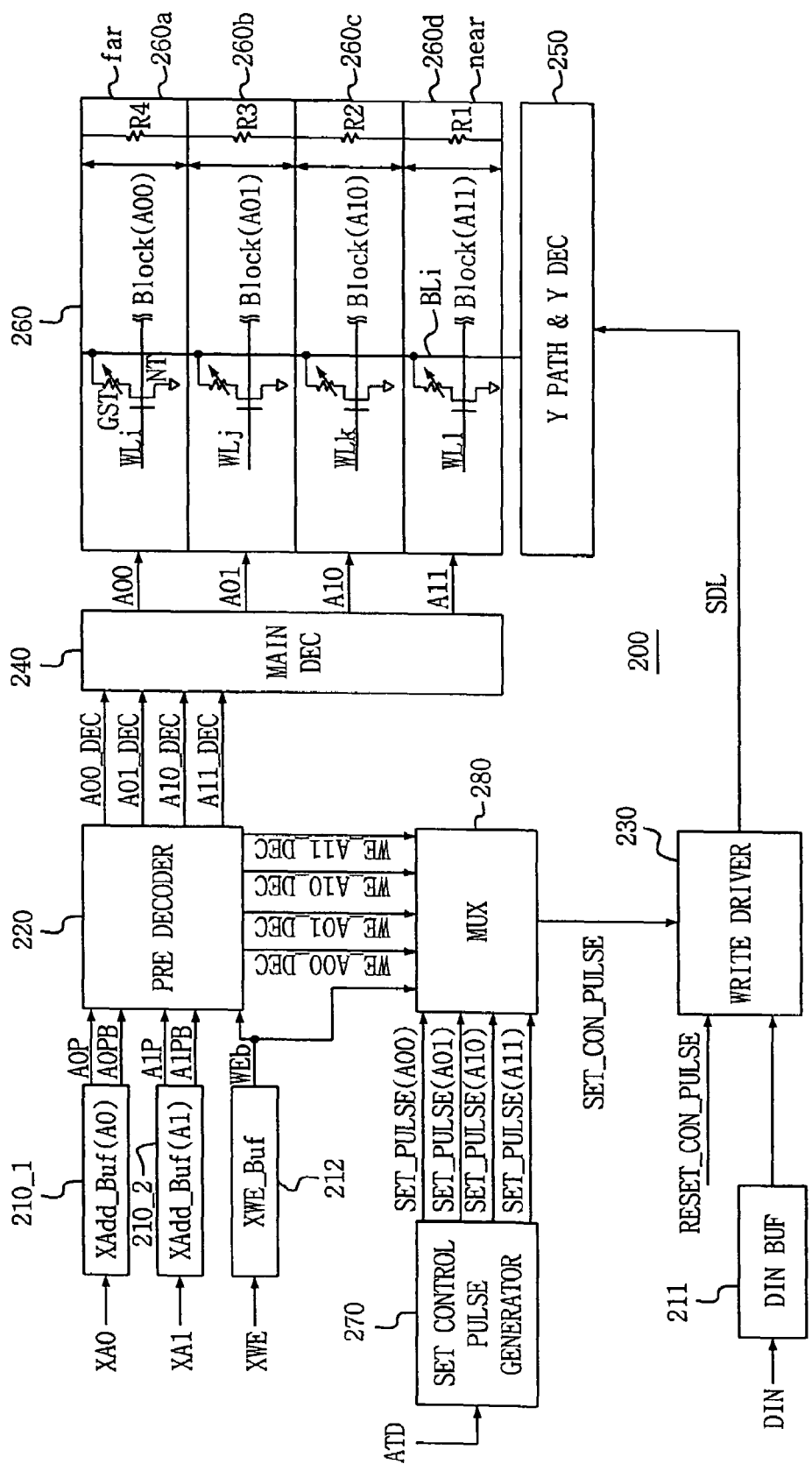
FIG. 8 is a circuit diagram of a phase-change memory cell device according to an embodiment of the present invention.

FIG. 8 is a circuit diagram of a phase-change memory cell device 200 according to an exemplary embodiment of the present invention. As shown, the phase-change memory cell device 200 includes address buffers 210_1 and 210_2, a input data buffer (DIN BUF) 211, a write enable buffer 212, a pre-decoder 220, a write driver 230, a main decoder 240, a memory array 260, a SET control pulse generator 270, a multiplexer (MUX) 280.

The input buffer 210_1 receives an input address signal XA0 and outputs buffered address signals A0P and A0PB to the pre-decoder 220. Likewise, the input buffer 210_2 receives an input address signal XA1 and outputs buffered address signals A1P and A1PB to the pre-decoder 220. Further, the write enable signal buffer 212 receives write enable signal XWE and outputs buffered write enable signal WEb to the pre-decoder 220 and the multiplexer 280.

The pre-decoder 220 receives the buffered address signals A0P, A0PB, A1P and A1PB, and the buffered write enable signal WEb, and outputs decoded address signals A00_DEC, A01_DEC, A10_DEC, and A11_DEC to the main decoder 240, and further outputs decoded write control signals WE_A00_DEC, WE_A01_DEC, WE_A10_DEC, and WE_A11_DEC to the multiplexer 280. In this exemplary embodiment, the decoded write control signals WE_A00_DEC, WE_A01_DEC, WE_A10_DEC, and WE_A11_DEC indicate which one of the blocks 260a, 260b, 260c, and 260d of the memory array 260 is being written.

The main decoder 240 receives the decoded signals A00_DEC, A01_DEC, A10_DEC, and A11_DEC, and outputs block selection signals A00, A01, A10 and A11. The block selection signals A00, A01, A10 and A11 drive word lines WLi, WLj, WLk, and WLl of the blocks 260a, 260b, 260c, and 260d, respectively, of the memory array 260.

The SET control pulse generator 270 is responsive to an address transition detection (ADT) signal to generate a plurality of SET_PULSEs having different pulse widths, namely, SET_PULSE (A00), SET_PULSE (A01), SET_PULSE (A10), and SET_PULSE (A11). As will be explained later in more detail, these different SET_PULSEs are selectively used to set the pulse width of a write SET current pulse applied to the memory array 260.

The multiplexer 280 selects and outputs (as SET_CON_PULSE) one of the SET_PULSE (A00), SET_PULSE (A01), SET_PULSE (A10), and SET_PULSE (A11), according to the buffered write enable signal WEb and the decoded write control signals WE_A00_DEC, WE_A01_DEC, WE_A10_DEC, and WE_A11_DEC. More specifically, when enabled by the buffered write enable signal WEb, the multiplexer 280 outputs the SET_PULSE (A00) when WE_A00_DEC is active; the multiplexer outputs the SET_PULSE (A01) when WE_A01_DEC is active; the multiplexer outputs the SET_PULSE (A10) when WE_A10_DEC is active; and the multiplexer outputs the SET_PULSE (A11) when WE_A11_DEC is active. Note that only one of WE_A00_DEC, WE_A01_DEC, WE_A10_DEC, and WE_A11_DEC is active at any given time.

Depending on the input data signal (DIN) from the input buffer 211, the write driver 230 outputs a write current pulse (SDL) according to either the SET current control pulse SET_CON_PULSE (from the multiplexer 280) or a RESET current control pulse RESET_CON_PULSE. For example, if the data to be written is LOW, the write driver outputs a SET programming write current pulse having a pulse width defined by SET_CON_PULSE. On the other hand, if the data to be written is HIGH, the write driver outputs a RESET programming write current pulse having a pulse width defined by RESET_CON_PULSE. Also, as will be explained later, the write driver 230 outputs a higher current for the RESET programming than for the SET programming (i.e., Ireset>Iset).

Column decoder 250 supplies the write current pulse SDL from the write driver 230 to selected columns of the memory blocks 160a, 160b, 160c, and 160d.

Figure 9:
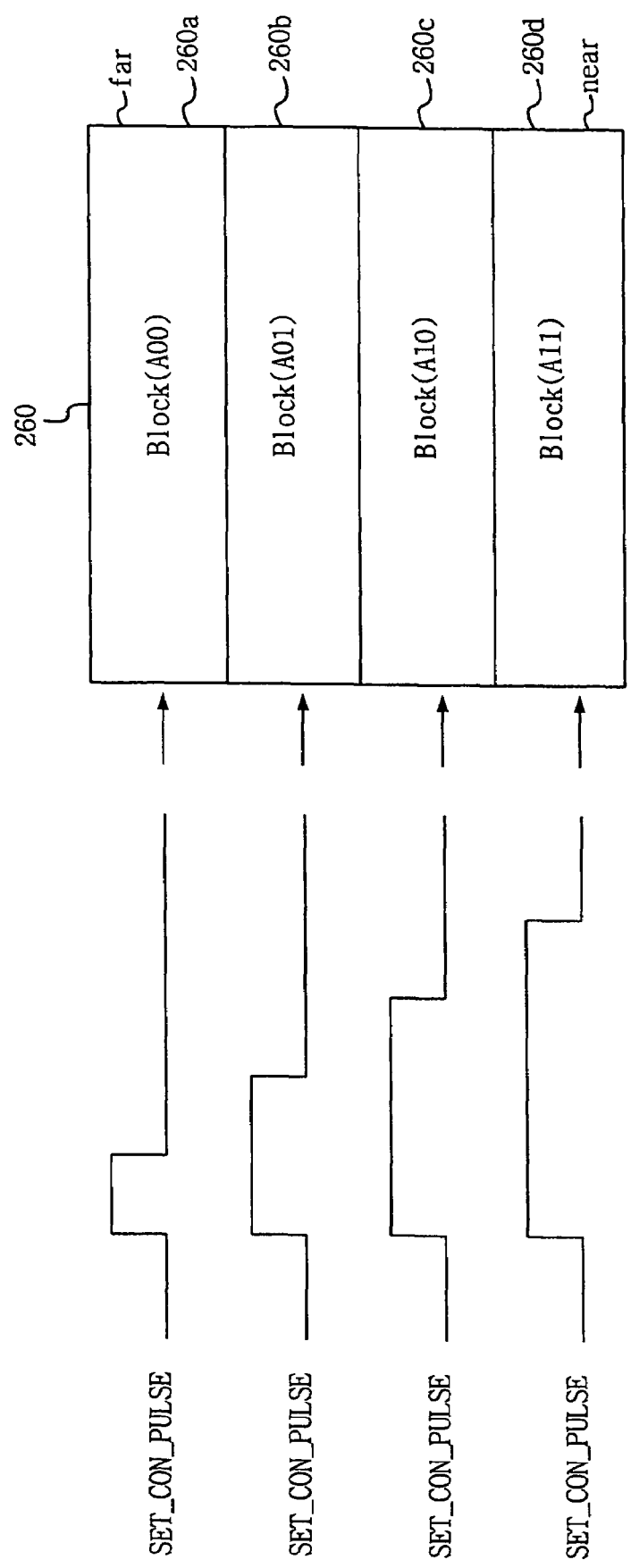
FIG. 9 illustrates set programming pulses applied to the phase-change memory cell blocks according to an embodiment of the present invention.

FIG. 9 illustrates the different pulse widths of SET current control signals (SET_CON_PULSE) which define the pulse widths of the SET write current pulses applied to respective blocks 260a, 260b, 260c, and 260d, of the phase-change memory cell array 260. As illustrated in FIG. 9, the pulse width of a SET current signal input into a far block (260a) is shorter than the pulse width of a SET current signal input into a near block (260d).

Figure 7:
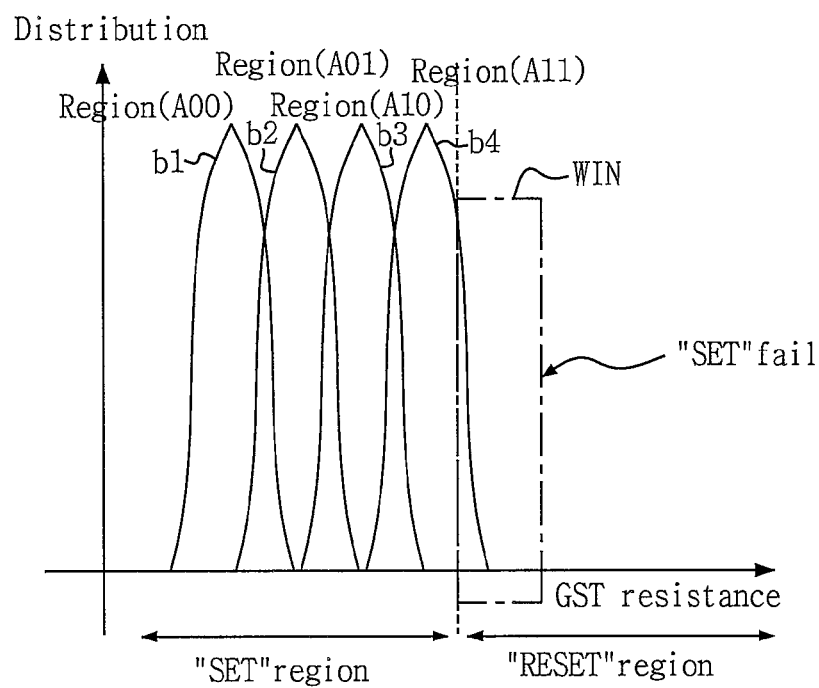
FIG. 7 illustrates SET resistance distribution regions of phase-change memory cells in different memory blocks.
Figure 10:
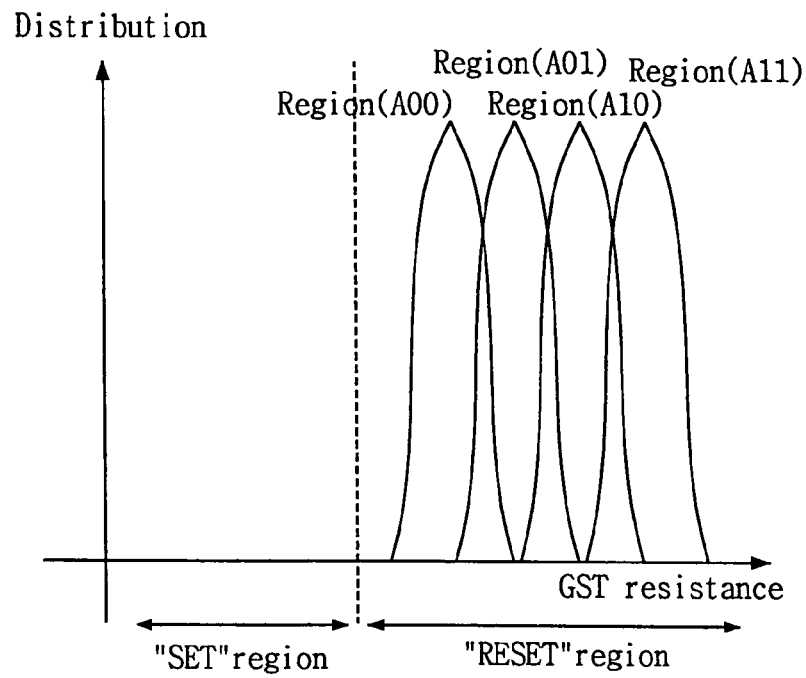
FIG. 10 illustrates RESET resistance distribution regions of phase-change memory cells in different memory blocks according to an embodiment of the present invention.
Figure 11:
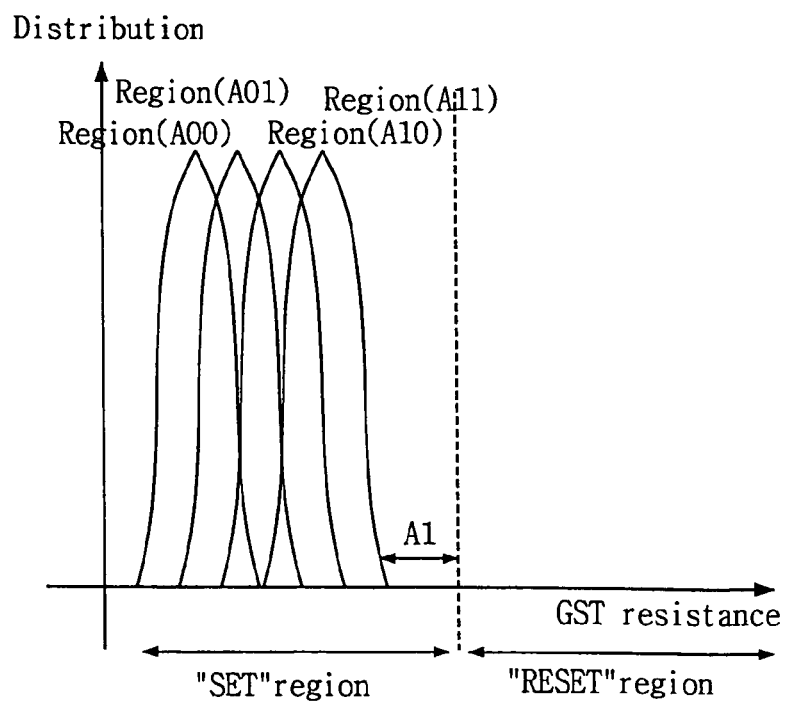
FIG. 11 illustrates SET resistance distribution regions of phase-change memory cells in different memory blocks according to an embodiment of the present invention.

By applying a shorter pulse current width to the far block 260a, over-programming of the memory cells of that block during the SET write operation is avoided. This is graphically illustrated in FIGS. 10 and 11. Assume that the resistance distribution regions during the RESET state are as shown in FIG. 10. Assume next that the SET write operation is carried out using the set current pulses shown in FIG. 9. The resultant resistance distribution regions in the SET state are shown in FIG. 11. When compared to previously discussed FIG. 7, the resistance distribution regions are more compacted, and accordingly, less power is needed to bring the far block 260a back to the RESET region.

Figure 12:
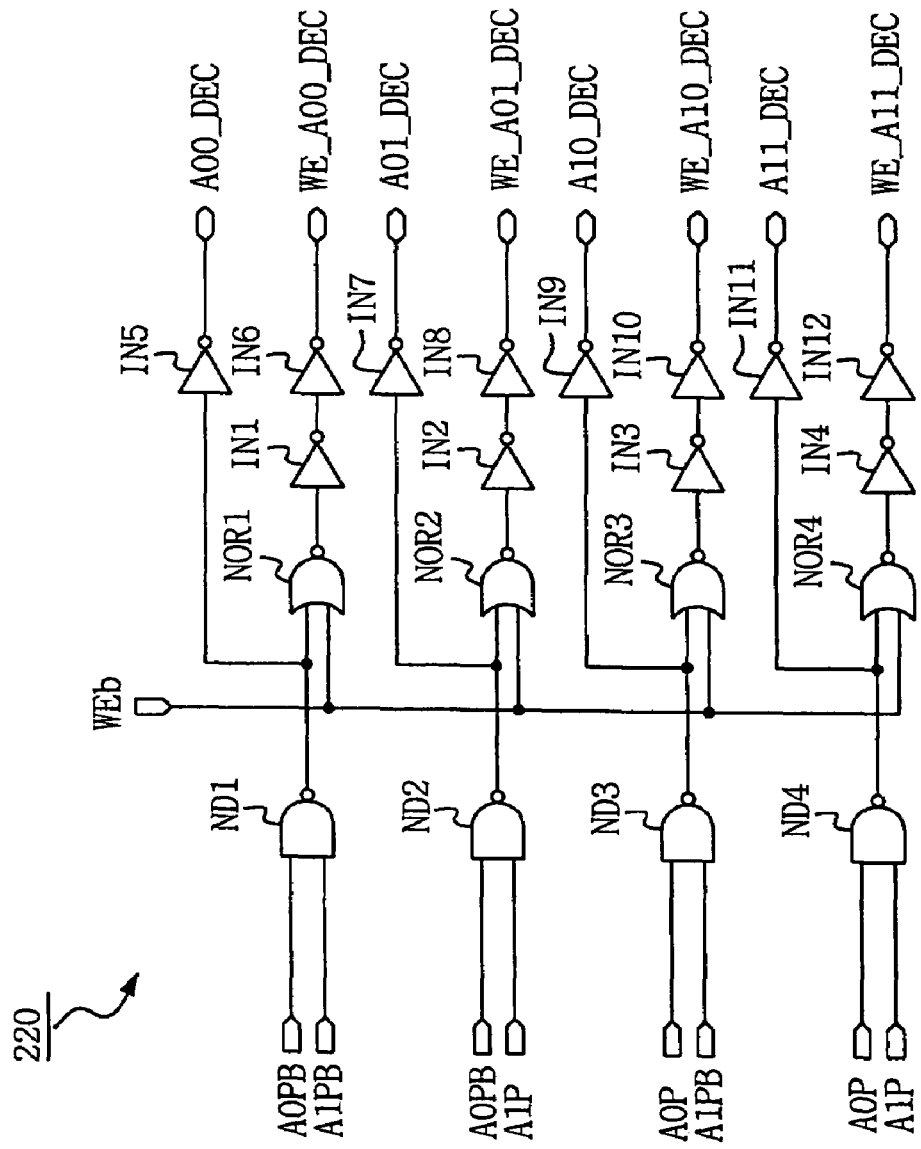
FIG. 12 is a circuit diagram of a pre-decoder according to an embodiment of the present invention.

FIG. 12 is a circuit diagram of a pre-decoder 220 according to an embodiment of the present invention. In this specific example, the pre-decoder 220 includes NAND gates ND1, ND2, ND3, and ND4; NOR gates NOR1, NOR2, NOR3, and NOR4; and inverters IN1, IN2, IN3, IN4, IN5, IN6, IN7, IN8, 1N9, IN10, IN11, and IN12. As shown, the pre-decoder 220 receives the buffered address signals A0P, A0PB, A1P and A1PB, and the buffered write enable signal WEb, and outputs decoded address signals A00_DEC, A01_DEC, A10_DEC, and A11_DEC, and decoded write control signals WE_A00_DEC, WE_A01_DEC, WE_A11_DEC, and WE_A11_DEC. In this example, only one of the decoded write control signals WE_A00_DEC, WE_A01_DEC, WE_A10_DEC, and WE_A11_DEC is HIGH when the buffered write enable signal WEb is LOW.

Figure 13:
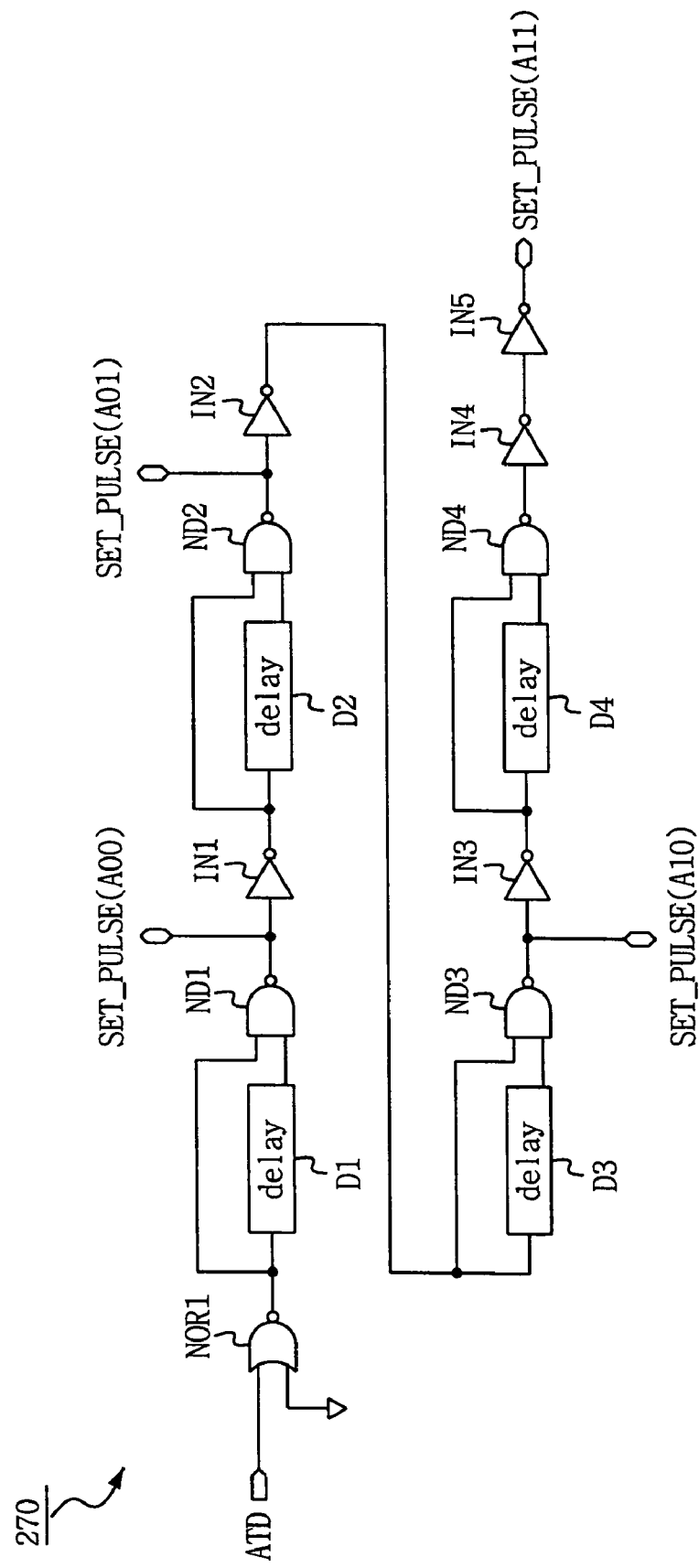
FIG. 13 is a circuit diagram of a set control pulse generator according to an embodiment of the present invention.

FIG. 13 is a circuit diagram of the SET control pulse generator 270 according to an embodiment of the present invention. In this specific example, SET control pulse generator includes NAND gates ND1, ND2, ND3, and ND4; NOR gate NOR1; delay circuits D1, D2, D3, and D4; and inverters IN1, IN2, IN3, IN4, and IN5. As should be apparent, the circuit of FIG. 13 is configured to output SET_PULSE_SIGNALs of different pulse widths as illustrated in FIG. 9.

Figure 14:
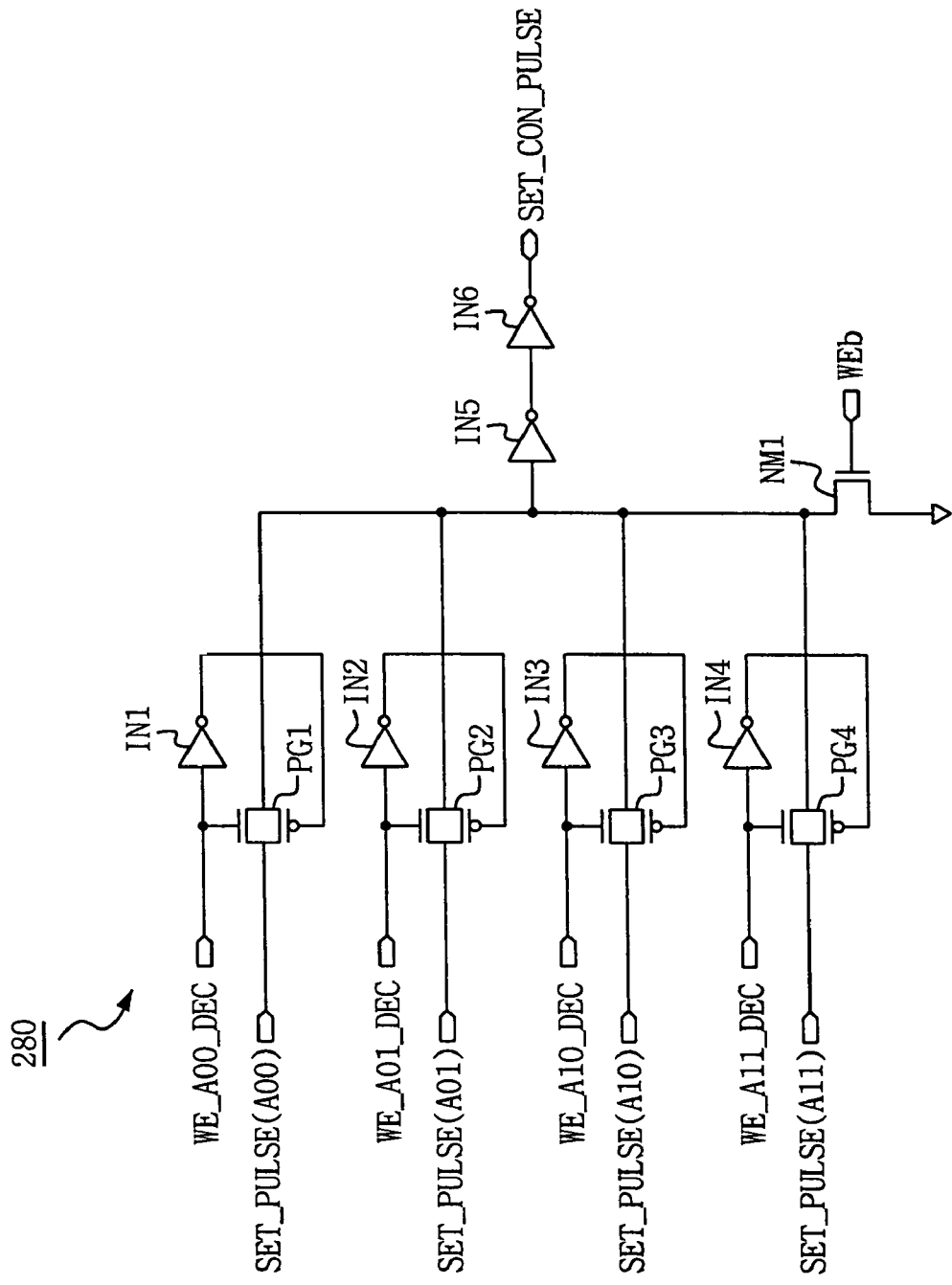
FIG. 14 is a circuit diagram of a multiplexer according to an embodiment of the present invention.

FIG. 14 is a circuit diagram of the multiplexer 280 according to an embodiment of the present invention. The multiplexer 280 of this specific example includes transmission gates PG1, PG2, PG3, and PG4; inverters IN1, IN2, IN3, IN4, IN5, and IN6; and transistor NM1. When the buffered write enable signal WEb is LOW, one of the SET_PULSES (A00), (A01), (A10), or (A11) is output as the SET_CON_PULSE when a respective one of the decoded write control signals WE_A00_DEC, WE_A01_DEC, WE_A10_DEC, and WE_A11_DEC is HIGH.

Figure 15:
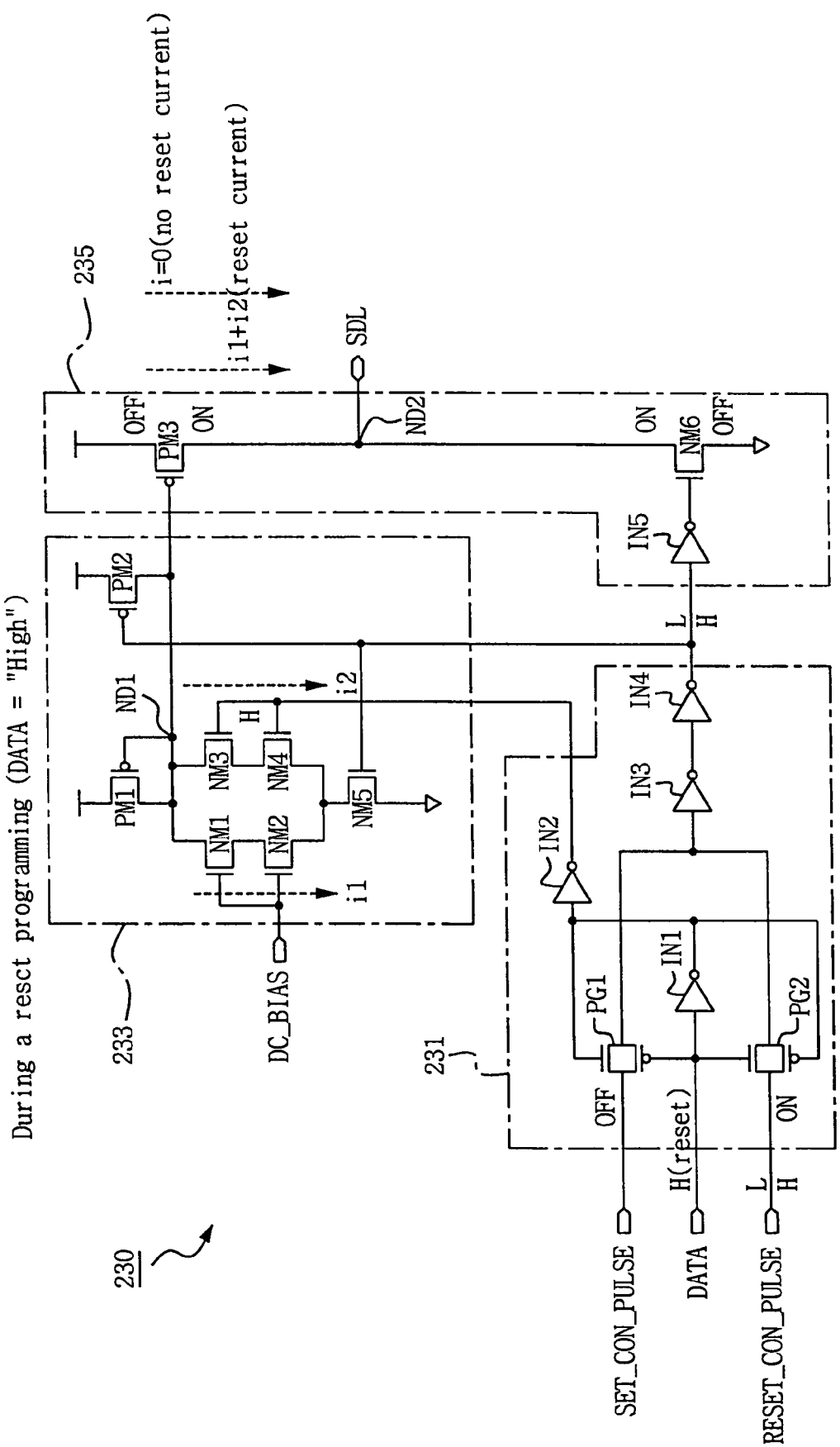
FIG. 15 is a circuit diagram of a write driver according to an embodiment of the present invention, where the write driver is in a RESET operation.
Figure 16:
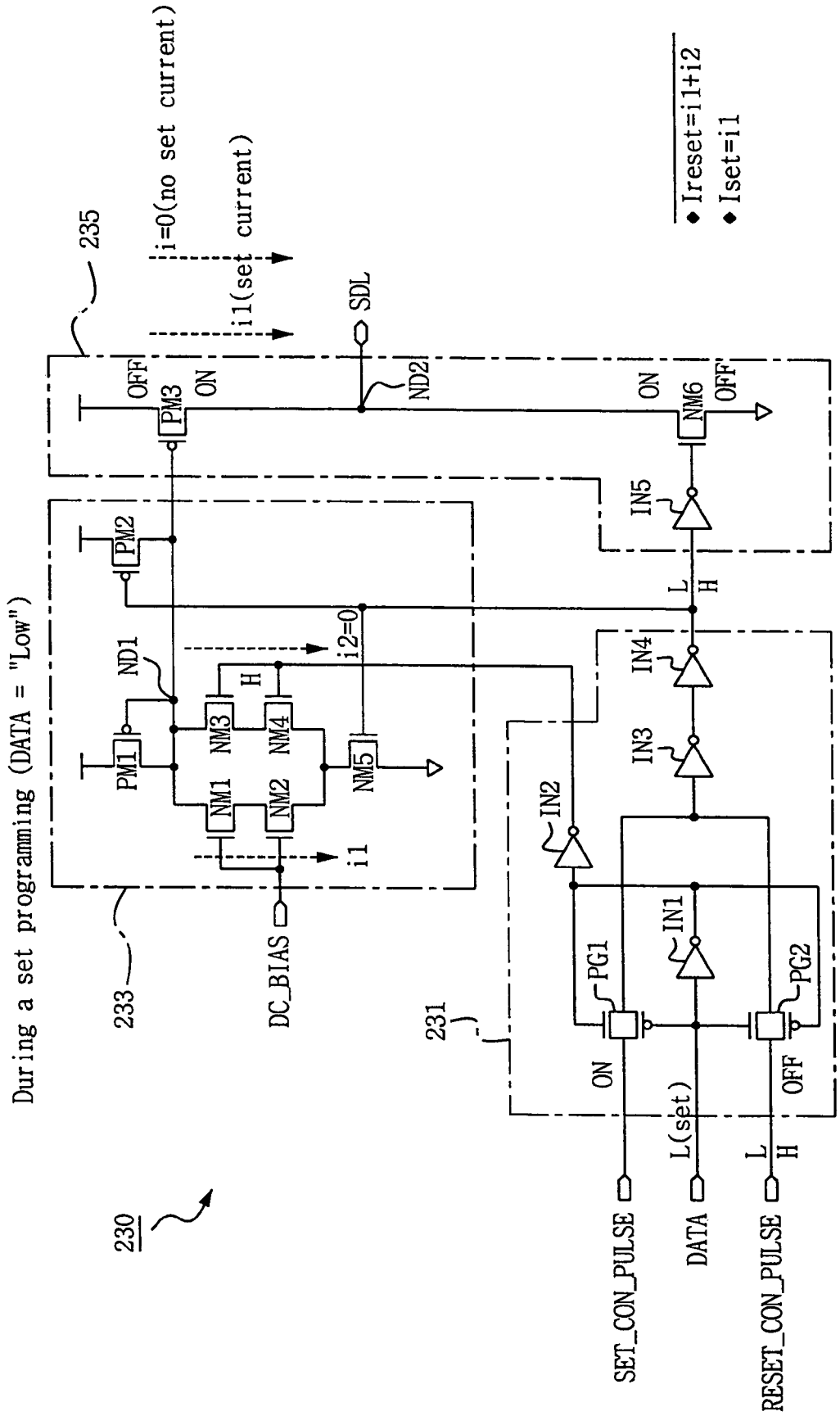
FIG. 16 is a circuit diagram of a write driver according to an embodiment of the present invention, where the write driver is in a SET operation.

FIG. 15 is a circuit diagram of a write driver 230 according to an embodiment of the present invention. The "H", "L", "OFF" and "ON" designations in the figure denote a RESET programming operation where the input data is HIGH. FIG. 16 is the same as FIG. 15, expect that "H", "L", "OFF" and "ON" designations in the figure denote a SET programming operation where the input data is LOW.

In the specific example of FIGS. 15 and 16, the write driver circuit 230 includes a logic circuit 231, a current mirror 233, and an output circuit 235. The logic circuit 231 includes transmission gates PG1 and PG2 and inverters IN1, IN2, IN3, and IN4. The current mirror 233 includes transistors NM1, NM2, NM3, NM4, NM5, PM1, and PM2. The output circuit 235 includes transistors PM3 and NM6, and inverter IN5.

Referring to FIG. 15, in the RESET programming operation, the input data (DATA) is HIGH, which turns off the transmission gate PG1. In the case where the RESET_CON_PULSE is LOW, the output of inverter IN4 of the logic circuit 231 is LOW. As such, transistor NM6 is ON, and transistor NM5 is OFF, and the node ND2 becomes LOW (ground). As a result, the output current SDL becomes Ireset=0 as shown. On the other hand, when the RESET_CON_ PULSE is HIGH, the output of inverter IN4 of the logic circuit 231 is HIGH, and the transistor NM6 is turned OFF. Further, since DATA is HIGH, the output of inverter IN2 of the logic circuit 231 is HIGH, and the transistors NM3 and NM4 of the current mirror 233 are turned ON. As a result, the output current SDL becomes Ireset=i1+i2 as shown.

Referring to FIG. 16, in the SET programming operation, the input data (DATA) is LOW, which turns off the transmission gate PG2. In the case where the SET_CON_PULSE is LOW, the output of inverter IN4 of the logic circuit 231 is LOW. As such, transistor NM6 is ON, and transistor NM5 is OFF, and the node ND2 becomes LOW (ground). As a result, the output current SDL becomes Iset=0 as shown. On the other hand, when the SET_CON_PULSE is HIGH, the output of inverter IN4 of the logic circuit 231 is HIGH, and the transistor NM6 is turned OFF. Further, since DATA is LOW, the output of inverter IN2 of the logic circuit 231 is LOW, and the transistors NM3 and NM4 of the current mirror 233 are turned OFF. As a result, the output current SDL becomes Iset=i1 as shown.

Figure 17:
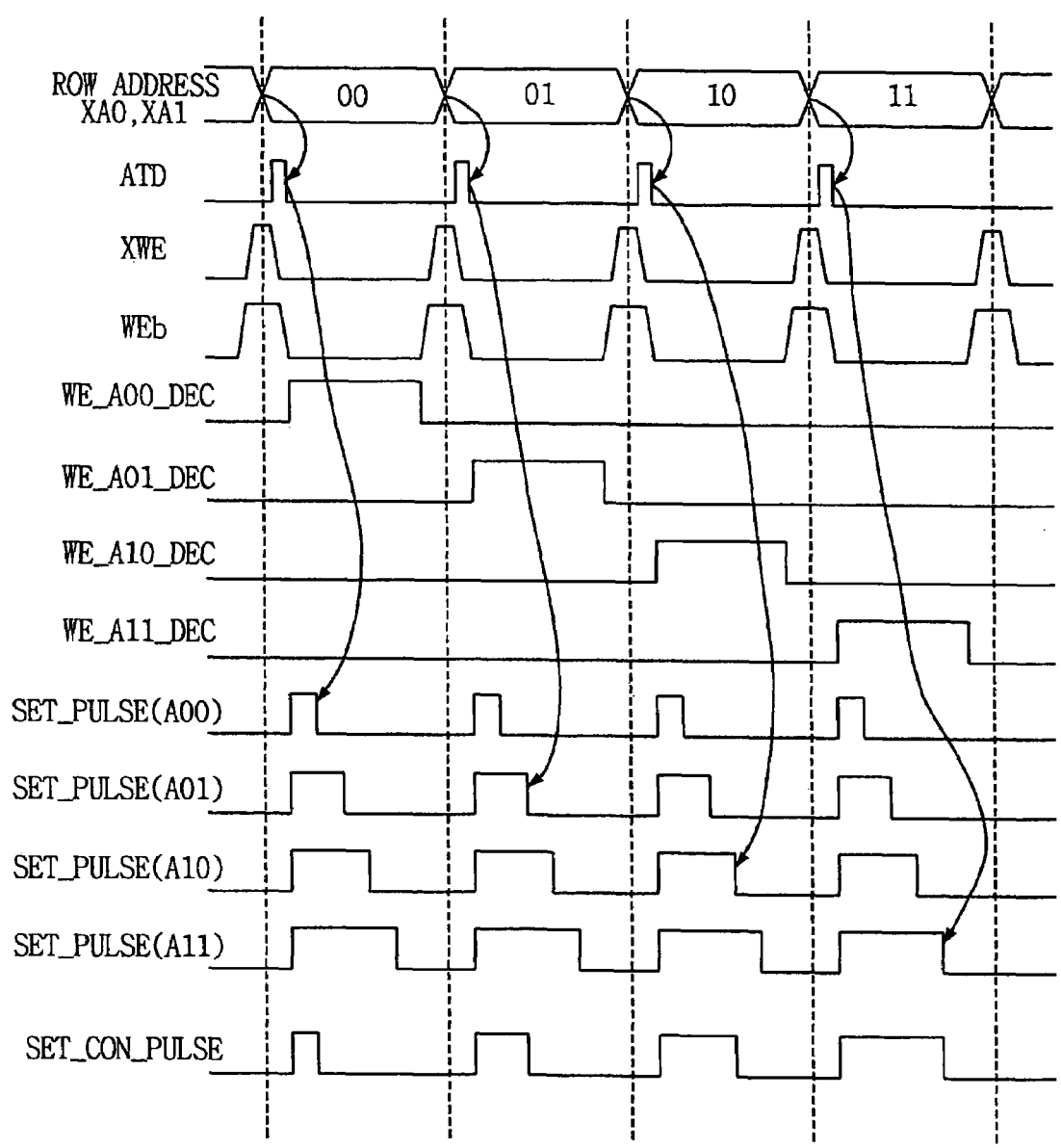
FIG. 17 is a timing diagram for describing the generation of set programming pulses according to an embodiment of the present invention.

FIG. 17 illustrates a timing diagram for explaining the generation of the SET programming pulse SET_CON_ PULSE. As shown in this figure, the buffer write enable signal WEb is HIGH when the write enable signal XWE is HIGH. Further, responsive to the falling edge of the address transition detection (ATD) signal, the SET_CON_PULSE signal is generated. The SET_CON_PULSE signal corresponds to SET_PULSE (A00) when WEb is LOW and WE_A00_DEC is HIGH; the SET_CON_PULSE signal corresponds to SET_ PULSE (A01) when WEb is LOW and WE_A01_DEC is HIGH; the SET_CON_PULSE signal corresponds to SET_ PULSE (A10) when WEb is LOW and WE_A10_DEC is HIGH; and the SET_CON_PULSE signal corresponds to SET_PULSE (A11) when WEb is LOW and WE_A11_DEC is HIGH.

Figure 18:
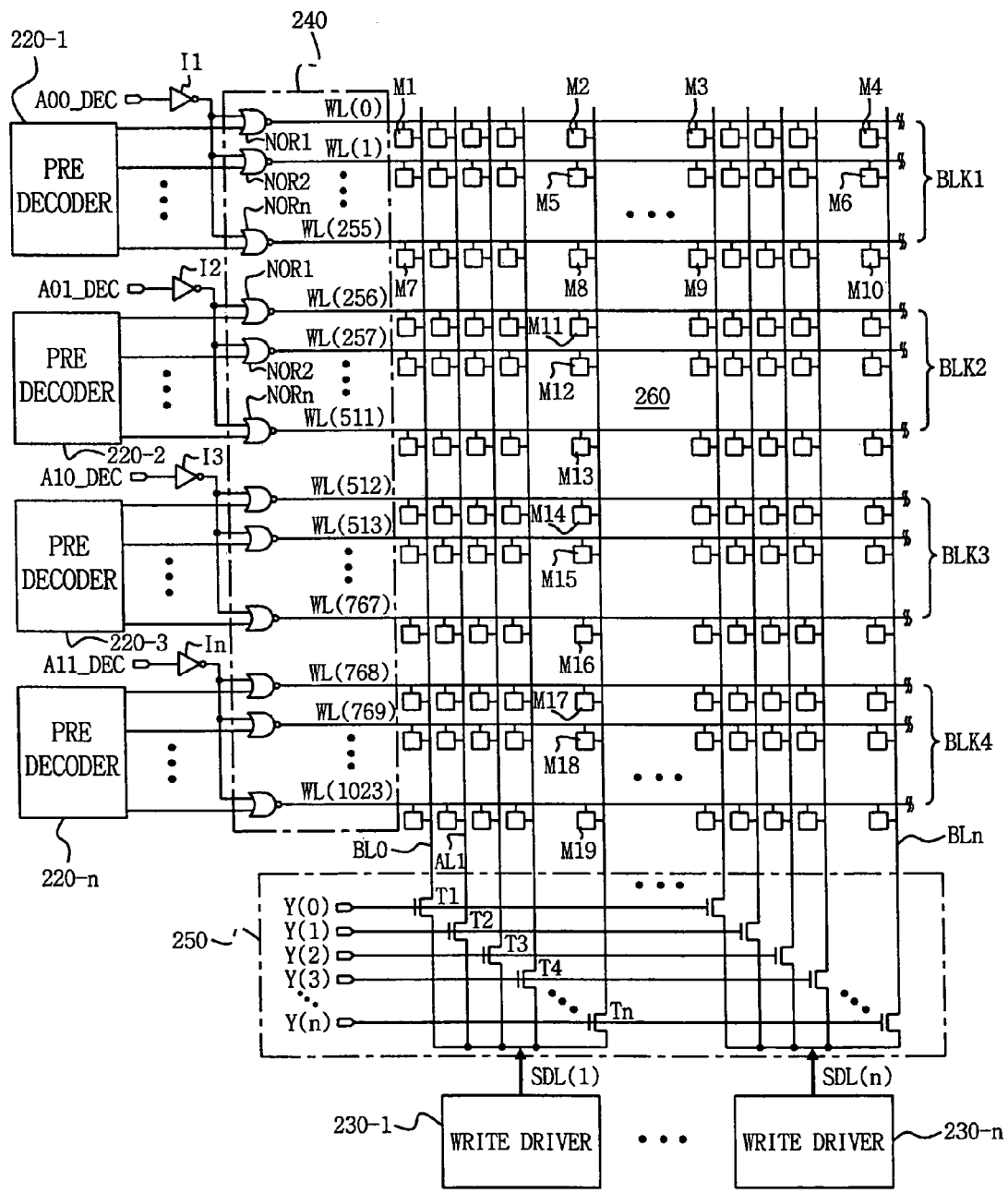
FIG. 18 is a circuit diagram of a main decoder, column decoder, and memory array according to an embodiment of the present invention.

For completeness of the explanation, FIG. 18 shows a detailed circuit diagram of phase-change random access memory (PRAM), including pre-decoders 220-1, 220-2, 220-3 and 220-4, a main decoder 240, column decoder 250, and a memory array according to an embodiment of the present invention. In this example, each block (BLK) of the memory array is comprised of 256 word lines (WL), with each word line WL coupled to a plurality of phase-change memory cells.

Outputs from the pre-decoders 220-1, 220-2, 220-3 through 220-n are applied to NOR elements of the main decoder 240, together with inverted decoded address signals from inverters I1 . . . In. The outputs of the NOR elements drive respective word lines WL. The column decoder 250 includes a plurality of select transistors T1 through Tn coupled between a corresponding write driver 230-1 . . . 230-n and bit lines BL0 . . . BLn.

The above-described first embodiment is generally characterized by controlling a write driver of a phase-change memory device such that the pulse width the SET pulse currents is varied according to a load between the write driver and an addressed memory cell. In this manner, over-programming of memory cells can be avoided, thus reducing the power consumption needed to reliably write the cells into the SET and RESET states.

Figure 19:
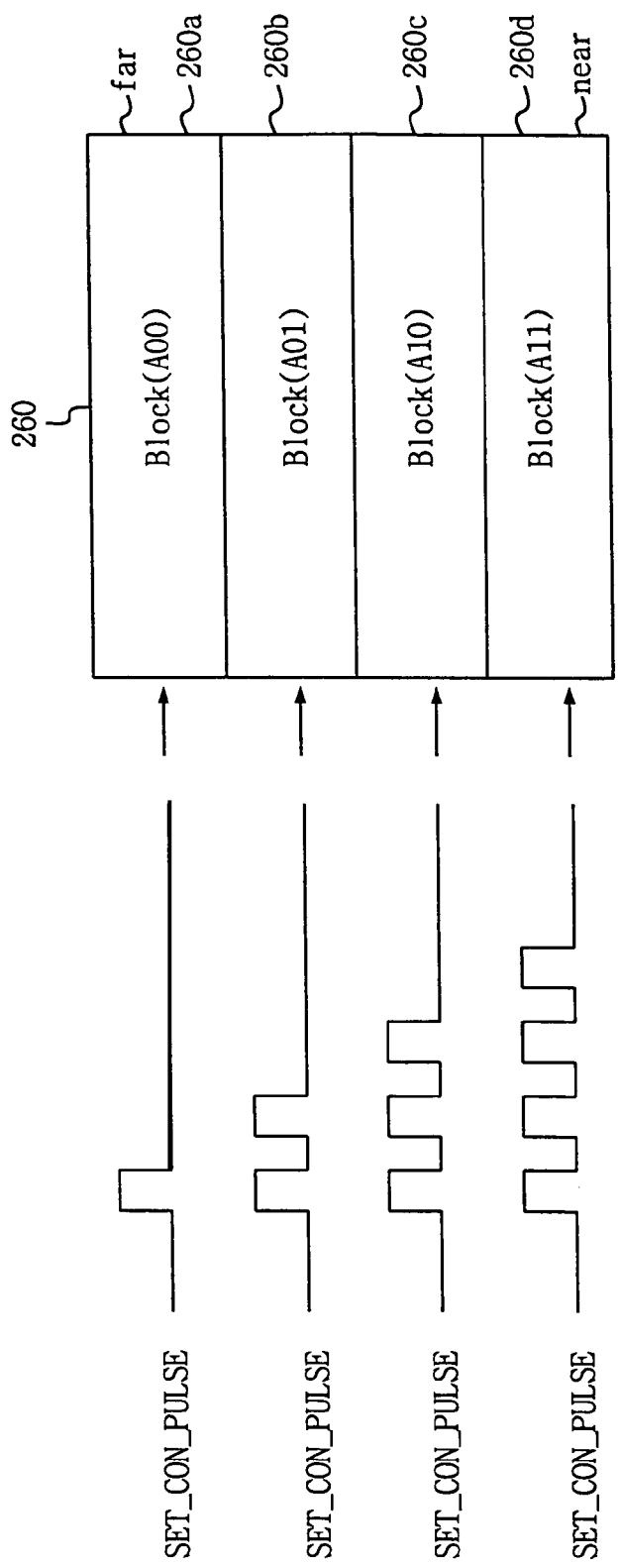
FIG. 19 illustrates set programming pulses applied to the phase-change memory cell blocks according to another embodiment of the present invention.

FIG. 19 illustrates an alternative to the first embodiment. That is, according to the second embodiment of FIG. 19, the write driver of the phase-change memory device is controlled such that the pulse count of the SET pulse currents is varied according to the load between the write driver and an addressed memory cell. As shown, different pulse counts of SET current control signals (SET_CON_PULSE) define pulse counts of the SET write current pulses applied to respective blocks 260a, 260b, 260c, and 260d, of the phase-change memory cell array 260. As illustrated in FIG. 19, the pulse count of a SET current signal input into a far block (260a) is less than the pulse count of a SET current signal input into a near block (260d).

Figure 20:
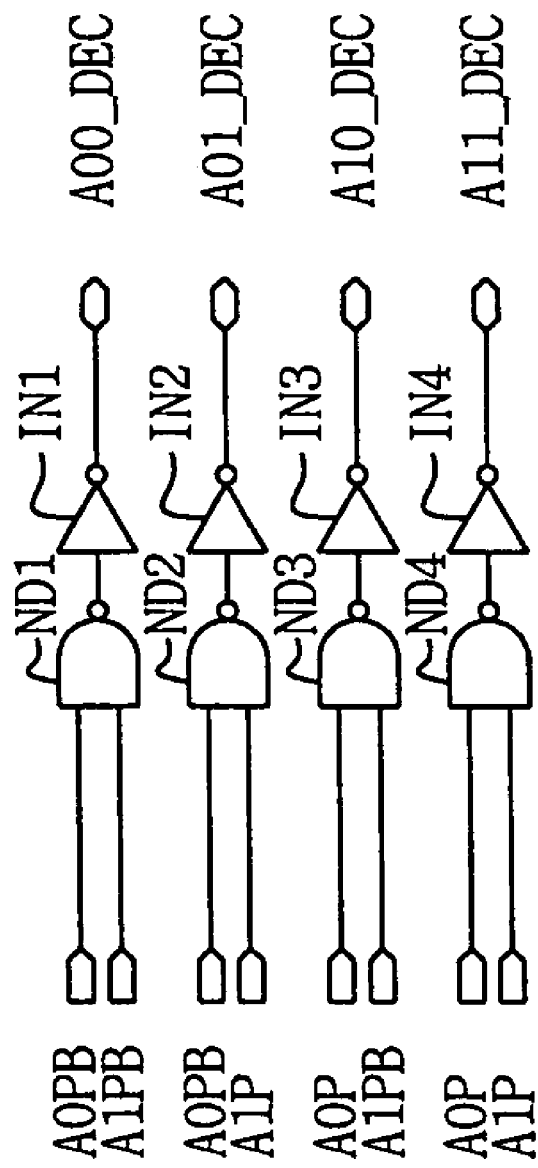
FIGS. 20 and 21 are circuit diagrams of a pre-decoder according to another embodiment of the present invention.
Figure 21:
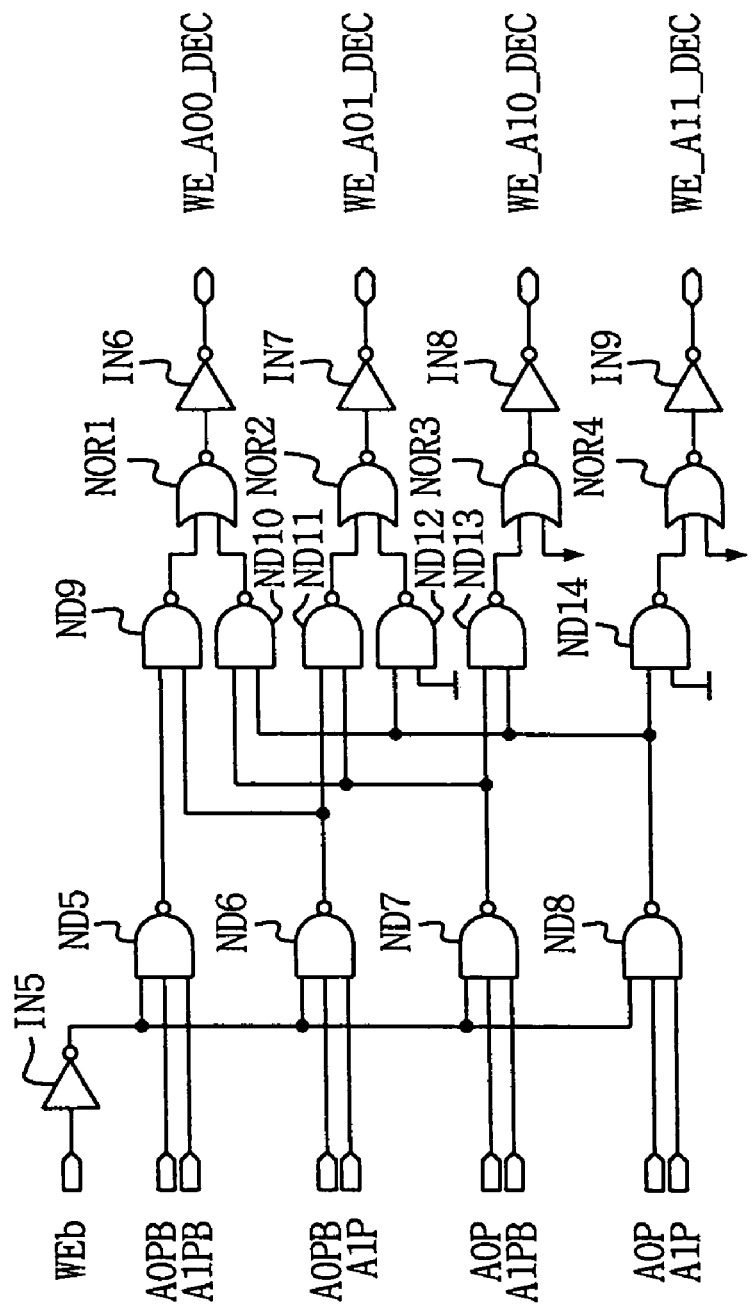

FIGS. 20 and 21 illustrate the pre-decoder 220 of FIG. 8 in the case of the second embodiment of the present invention. In this specific example, the pre-decoder 220 includes NAND gates ND1 . . . ND14; NOR gates NOR1 . . . ND4; and inverters IN1 . . . IN9. As shown, the pre-decoder 220 receives the buffered address signals A0P, A0PB, A1P and A1PB, and the buffered write enable signal WEb, and outputs decoded address signals A00_DEC, A01_DEC, A10_DEC, and A11_DEC, and decoded write control signals WE_A00_DEC, WE_A01_DEC, WE_A10_DEC, and WE_A11_DEC. In this example, one or more of the decoded write control signals WE_A00_DEC, WE_A01_DEC, WE_A10_DEC, and WE_A11_DEC is HIGH when the buffered write enable signal WEb is LOW.

Figure 22:
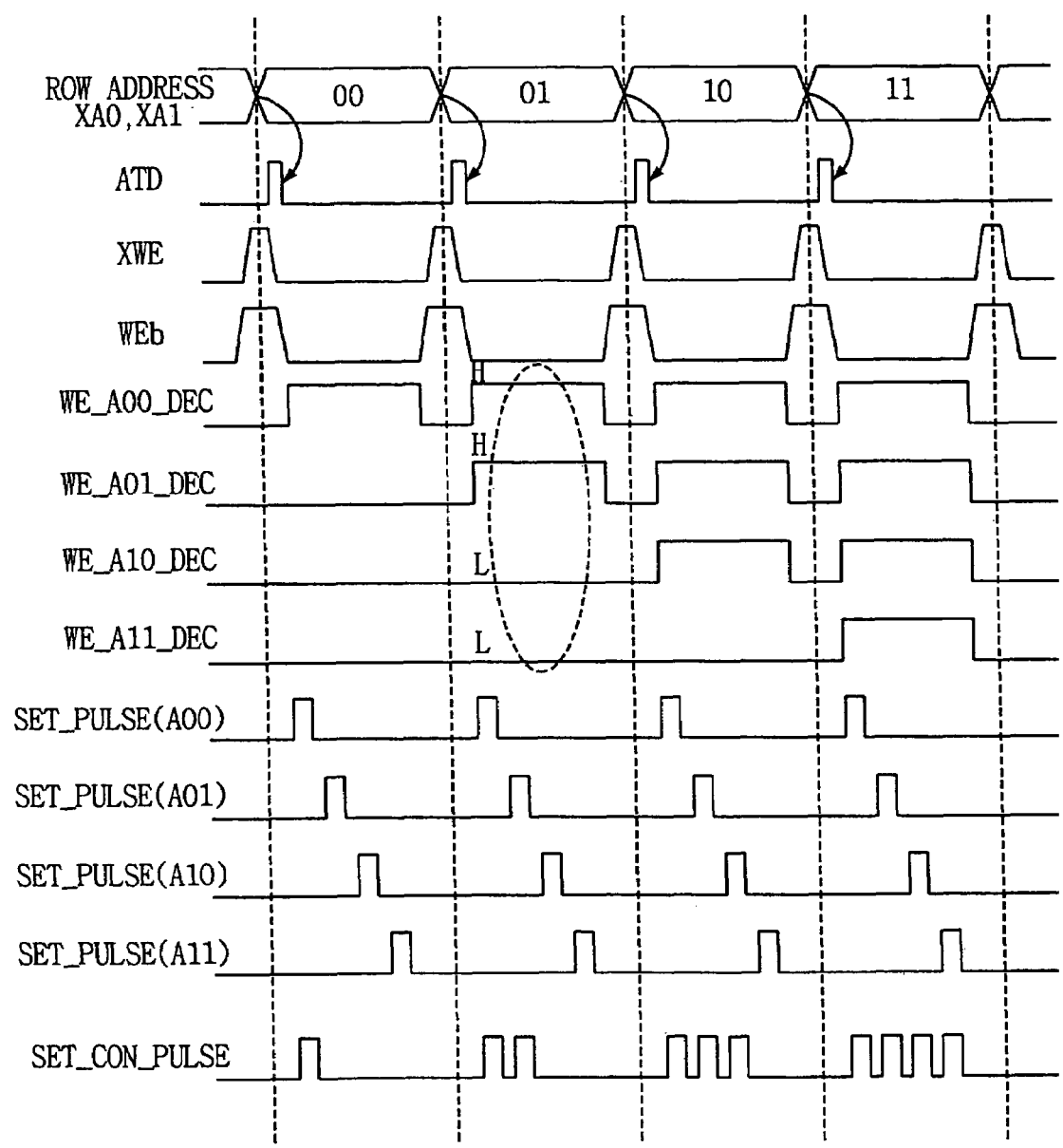
FIG. 22 is a timing diagram for describing the generation of set programming pulses according to another embodiment of the present invention.

FIG. 22 illustrates a timing diagram for explaining the generation of the SET programming pulse SET_CON_ PULSE according to the second embodiment of the present invention. As shown in this figure, the buffer write enable signal WEb is HIGH when the write enable signal XWE is HIGH. Further, responsive to the falling edge of the address transition detection (ATD) signal, the SET_CON_PULSE signal is generated.

As shown in FIG. 22, the SET_CON_PULSE signal corresponds to SET_PULSE (A00) when WEb is LOW and only WE_A00_DEC is HIGH; the SET_CON_PULSE signal corresponds to the combination of SET_PULSE (A00) and SET_ PULSE (A01) when WEb is LOW and only WE_A00_DEC and WE_A01_DEC are HIGH; the SET_ CON_PULSE signal corresponds to the combination of SET_ PULSE (A00), SET_PULSE (A01) and SET_PULSE (A10) when WEb is LOW and only WE_A00_DEC, WE_A01_DEC and WE_A10_DEC are HIGH; the SET_ CON_PULSE signal corresponds to combination of SET_ PULSE (A00), SET_ PULSE (A01), SET_PULSE (A0) and SET_PULSE (A11) when WEb is LOW and WE_A00_DEC, WE_A01_DEC, WE_A10_DEC and WE_A11_DEC are all HIGH.

Figure 23:
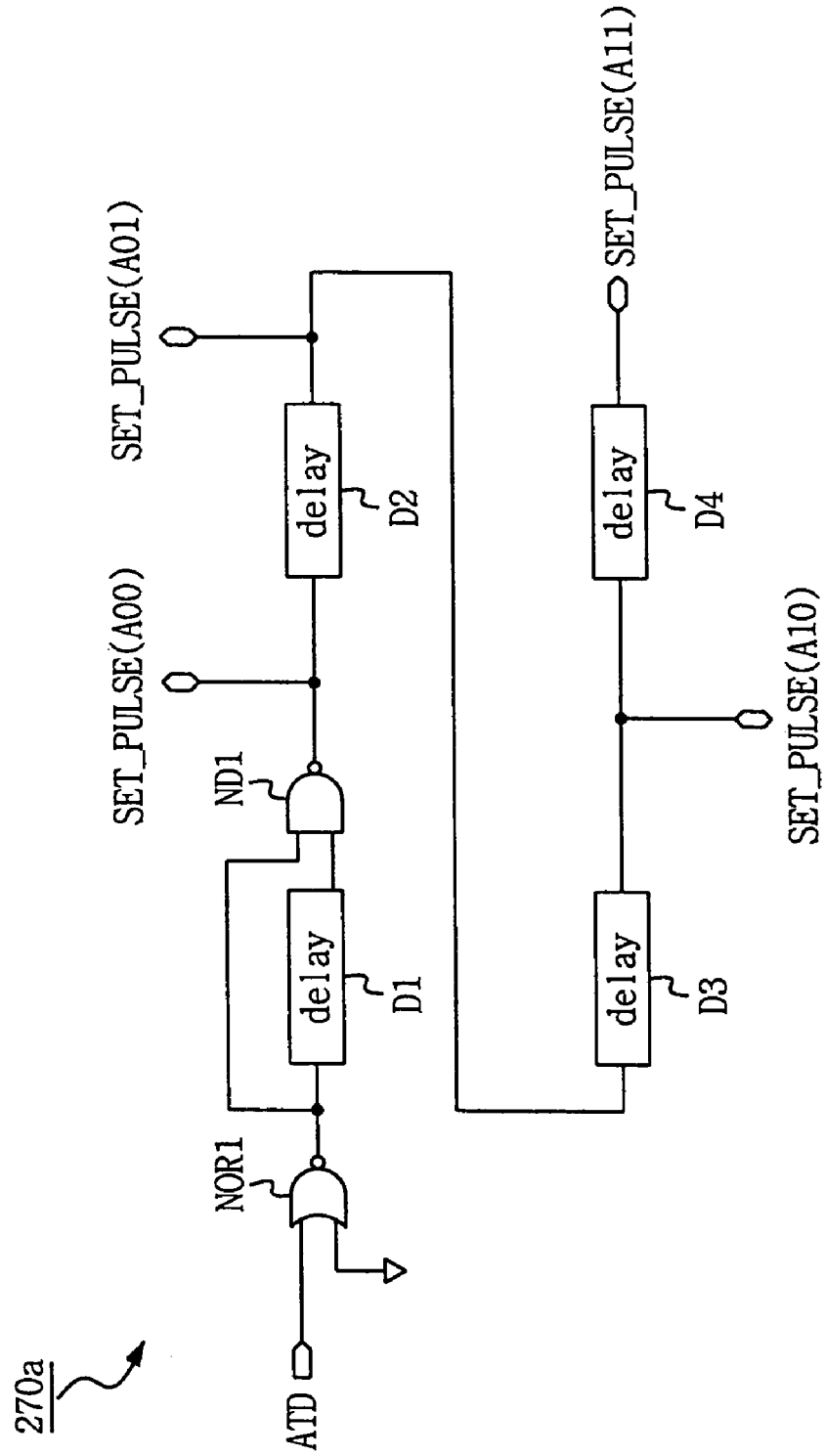
FIG. 23 is a circuit diagram of a set control pulse generator according to another embodiment of the present invention.

FIG. 23 is a circuit diagram of the SET control pulse generator 270 of FIG. 8 according to the second embodiment of the present invention. In this specific example, SET control pulse generator includes NOR gate NOR1; NAND gate ND1; and delay circuits D1, D2, D3, and D4. As should be apparent, the circuit of FIG. 23 is configured to output SET_PULSE signals (A01), (A01), (A10) and (A11) as illustrated in FIG. 22.

The above-described second embodiment is generally characterized by controlling a write driver of a phase-change memory device such that the pulse count of the SET pulse current is varied according to a load between the write driver and an addressed memory cell. In this manner, over-programming of memory cells can be avoided, thus reducing the power consumption needed to reliably write the cells into the SET and RESET states.

Figure 24:
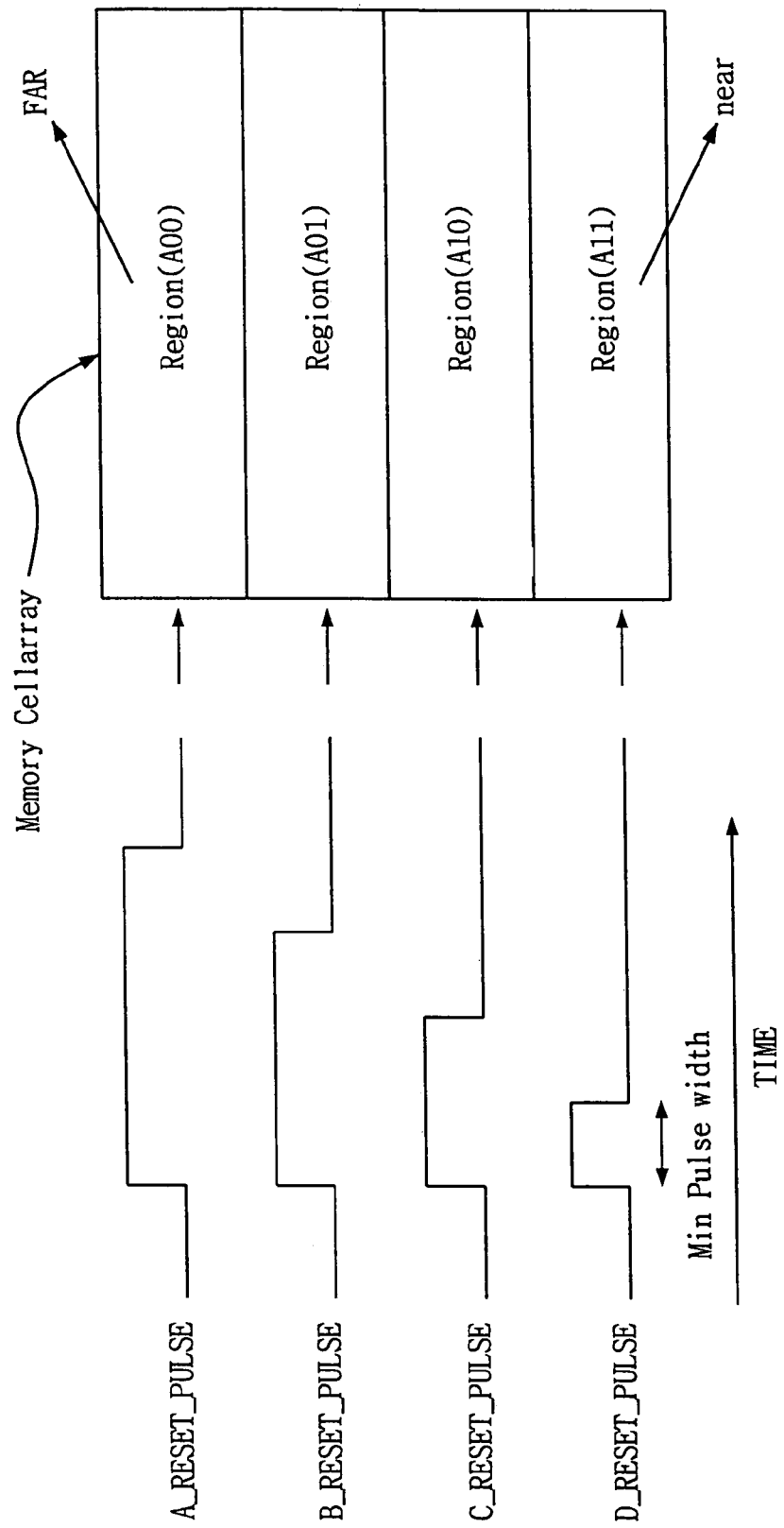
FIG. 24 illustrates reset programming pulses applied to the phase-change memory cell blocks according to yet another embodiment of the present invention.

FIG. 24 illustrates an alternative to the first and second embodiments. That is, according to the third embodiment of FIG. 24, the write driver of the phase-change memory device is controlled such that the pulse width of the RESET pulse currents is varied according to the load between the write driver and an addressed memory cell. As shown, different pulse widths of the RESET current control signals applied to respective blocks 260a, 260b, 260c, and 260d are defined by pulse widths of the RESET pulses A_RESET_PULSE, B_RESET_PULSE, C_RESET_PULSE, and D_RESET_PULSE. As illustrated in FIG. 24, the pulse width of a RESET current signal input into a far block Region (A00) is greater than the pulse width of a RESET current signal input into a near block Region (A11).

Figure 25:
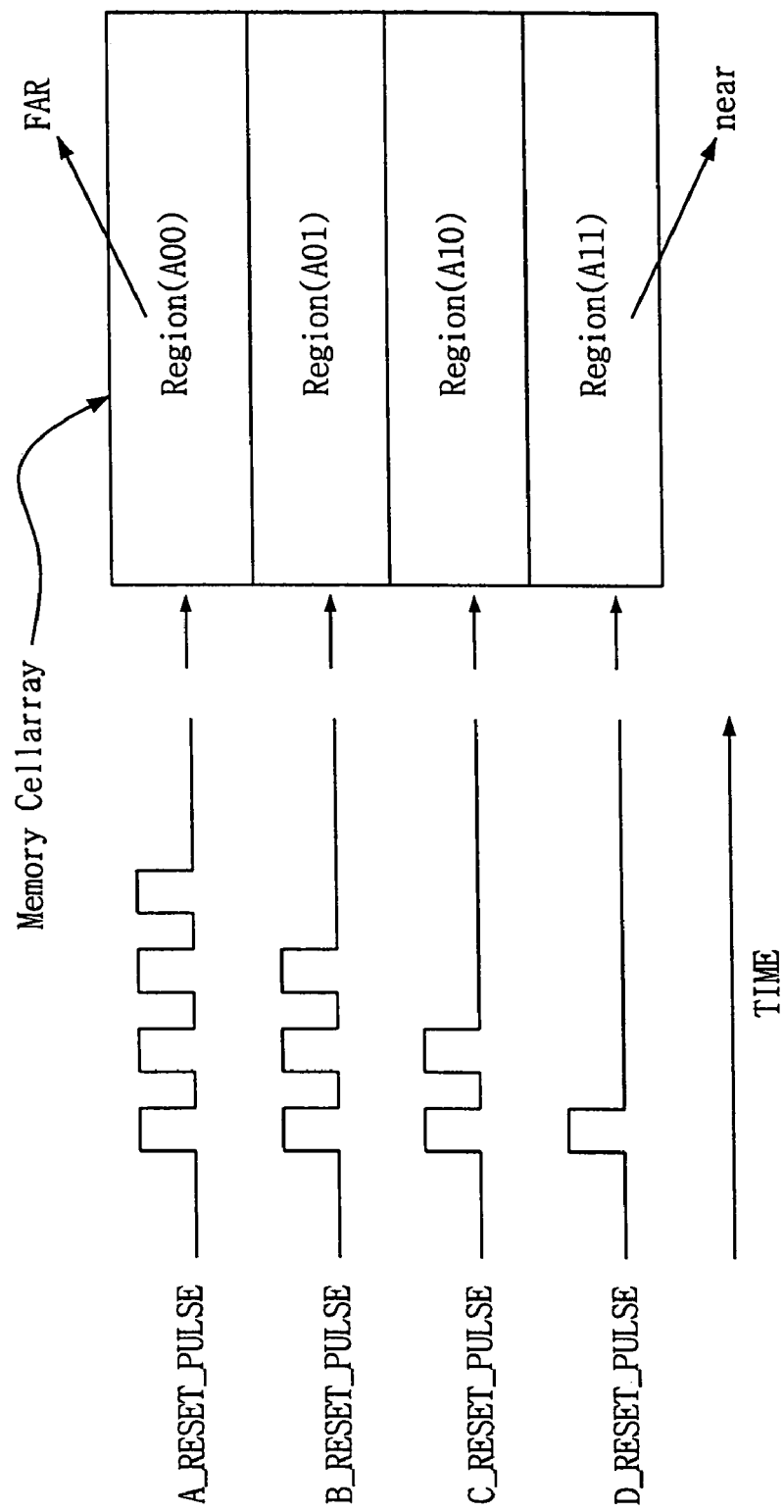
FIG. 25 illustrates reset programming pulses applied to the phase-change memory cell blocks according to yet another embodiment of the present invention.

FIG. 25 illustrates yet another alternative to the first through third embodiments. That is, according to the fourth embodiment of FIG. 25, the write driver of the phase-change memory device is controlled such that the pulse count of the RESET pulse currents is varied according to the load between the write driver and an addressed memory cell. As shown, different pulse counts of the RESET current control signals applied to respective blocks 260a, 260b, 260c, and 260d are defined by pulse counts of the RESET pulses A_RESET_PULSE, B_RESET_PULSE, C_RESET_PULSE, and D_RESET_PULSE. As illustrated in FIG. 25, the pulse count of a RESET current signal input into a far block Region (A00) is greater than the pulse count of a RESET current signal input into a near block Region (A11).

Figure 26:
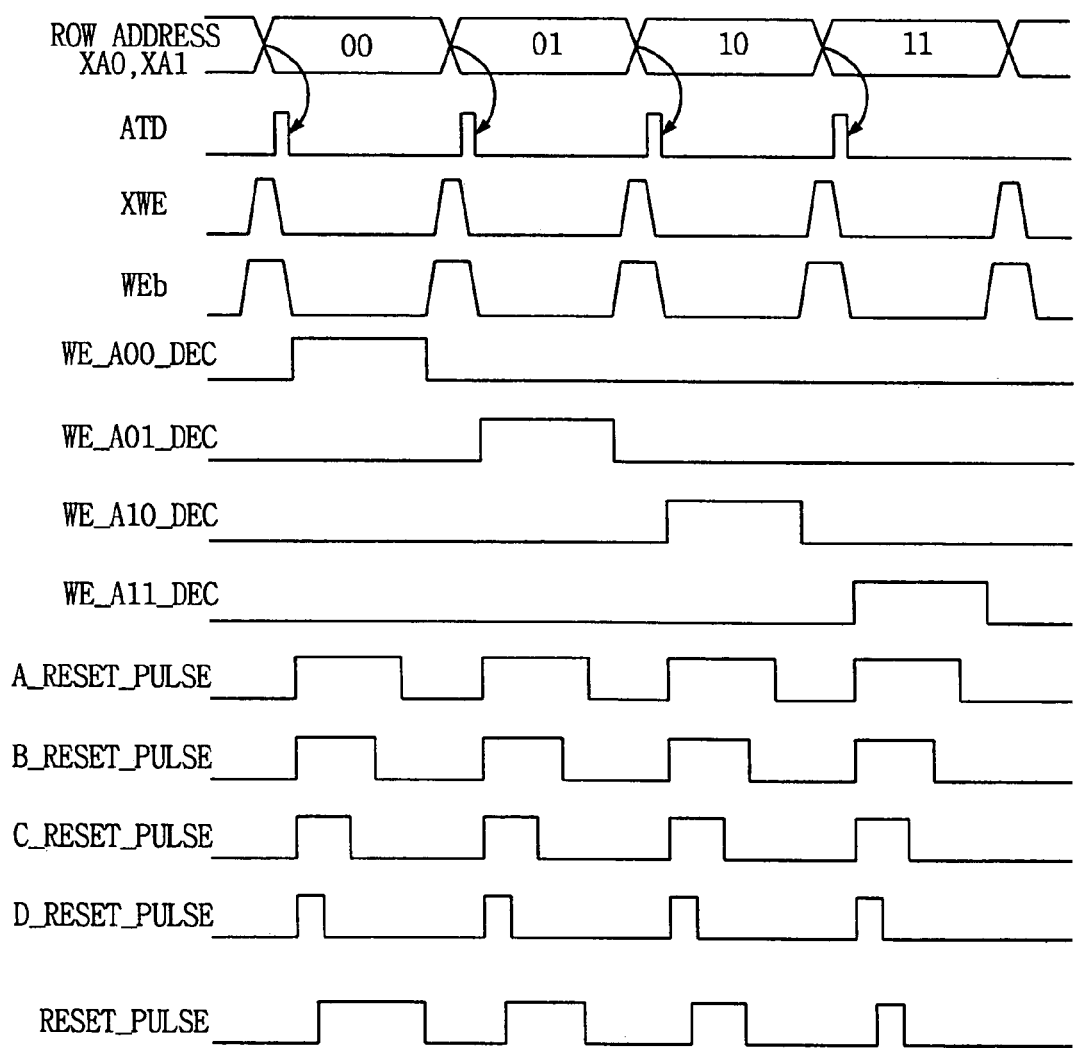
FIGS. 26 and 27 are timing diagrams for describing the generation of reset programming pulses according to other embodiments of the present invention.

FIG. 26 illustrates a timing diagram for explaining the generation of the RESET programming pulse RESET_CON_PULSE according to the third embodiment of the present invention. As shown in this figure, the buffer write enable signal WEb is HIGH when the write enable signal XWE is HIGH. Further, responsive to the falling edge of the address transition detection (ATD) signal, the RESET_CON_PULSE signal is generated.

As shown in FIG. 26, the RESET_CON_PULSE signal corresponds to A_RESET_PULSE when WEb is LOW and WE_A00_DEC is HIGH; the RESET_CON_PULSE signal corresponds to B_RESET_PULSE when WEb is LOW and WE_A01_DEC is HIGH; the RESET_CON_PULSE signal corresponds to C_RESET_PULSE when WEb is LOW and WE_A10_DEC is HIGH; and the RESET_CON_PULSE signal corresponds to D_SET_PULSE when WEb is LOW and WE_A11_DEC is all HIGH. In this case, A_RESET_PULSE, B_RESET_PULSE, C_RESET_PULSE, and D_SET_PULSE are as shown in FIG. 24.

Figure 27:
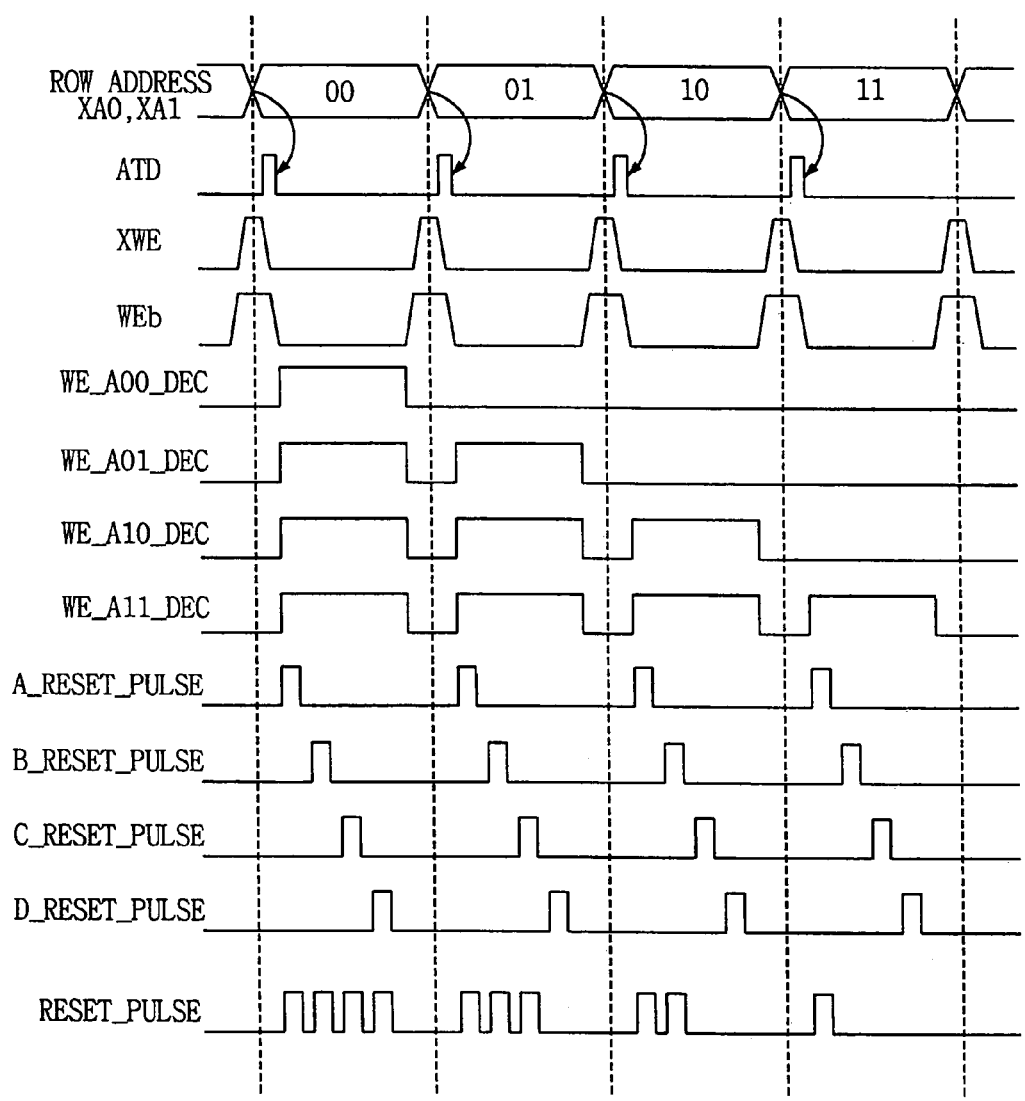

FIG. 27 illustrates a timing diagram for explaining the generation of the RESET programming pulse RESET_CON_PULSE according to the fourth embodiment of the present invention. As shown in this figure, the buffer write enable signal WEb is HIGH when the write enable signal XWE is HIGH. Further, responsive to the falling edge of the address transition detection (ATD) signal, the RESET_CON_PULSE signal is generated.

As shown in FIG. 27, the RESET_CON_PULSE signal corresponds to the combination of A_RESET_PULSE, B_RESET_PULSE, C_RESET_PULSE, and D_RESET_PULSE when WEb is LOW and WE_A00_DEC, WE_A01_DEC, WE_A10_DEC and WE_A11_DEC are all HIGH; the RESET_CON_PULSE signal corresponds to the combination of A_RESET_PULSE, B_RESET_PULSE, and C_RESET_PULSE when WEb is LOW and only WE_A01_DEC, WE_A10_DEC, and WE_A11_DEC are HIGH; the RESET_CON_PULSE signal corresponds to the combination of A_RESET_PULSE and B_RESET_PULSE when WEb is LOW and only WE_A10_DEC and WE_A11_DEC are HIGH; and the RESET_CON_PULSE signal corresponds to A_RESET_PULSE when WEb is LOW and only WE_A11_DEC is HIGH.

The above-described third and fourth embodiments are generally characterized by controlling a write driver of a phase-change memory device such that the pulse width or pulse count of the RESET pulse current is varied according to a load between the write driver and an addressed memory cell. In this manner, over-programming of memory cells can be avoided, thus reducing the power consumption needed to reliably write the cells into the RESET state.

Another embodiment of the present invention will now be described with reference to FIG. 28.

Figure 28:
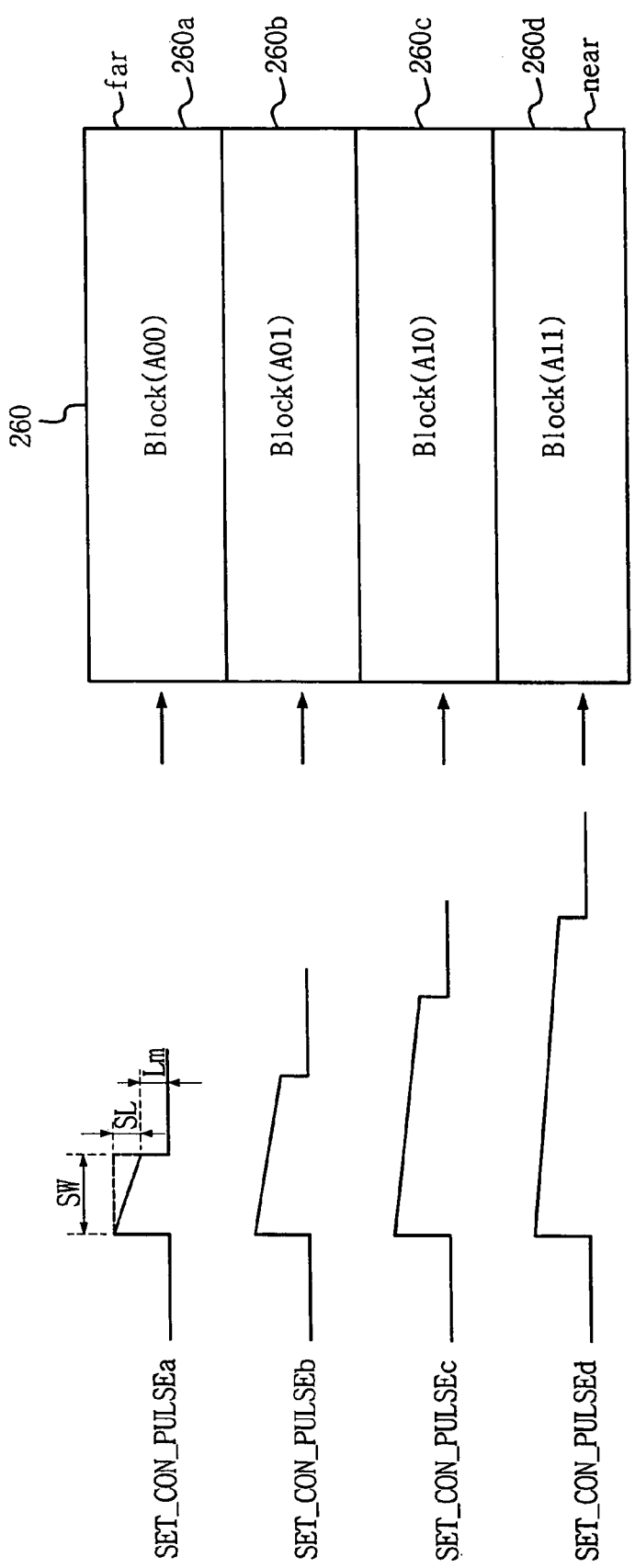
FIG. 28 illustrates set programming pulses applied to the phase-change memory cell blocks according to still another embodiment of the invention.

FIG. 28 illustrates SET sloped pulse current control signals SET_CON_PULSEa through SET_CON_PULSEd having respectively different pulse widths and different pulse slopes. The control signals SET_CON_PULSEa through SET_CON_PULSEd shown in FIG. 28 are substantially the same as set current control signals SET_CON_PULSE shown in FIG. 9, except that pulse magnitudes of the set current control signals SET_CON_PULSEa through SET_CON_PULSEd of FIG. 28 are varied within each pulse. That is to say, the signals are "sloped pulse" signals.

Similar to the embodiment of FIG. 9, the set sloped pulse current control signals SET_CON_PULSEa through SET_CON_PULSEd of FIG. 28 are applied to respective blocks 260a, 260b, 260c and 260d of the phase-change memory cell array 260. As shown in FIG. 28, a pulse width of the signal input to a far block 260a is shorter than a pulse width of the signal input to a near block 260d, and also a pulse slope of the signal input to the far block 260a is greater than a pulse slope of the signal input to the near block 260d.

Referring to the set current control signal SET_CON_PULSEa of FIG. 28, the pulse slope corresponds to the ratio SL/SW. Here, SL denotes a slope height, and SW denotes a pulse width. Also, in FIG. 28, Lm denotes the pulse height (current magnitude) at the terminating end of the current pulse, and Lm+SL equates to the pulse height at the front end of the current pulse.

In the example of FIG. 28, the terminating pulse height Lm is the same for each of the current control signals SET_CON_PULSEa through SET_CON_PULSEd. Likewise, the beginning pulse height (SL+Lm) is the same for each of the current control signals SET_CON_PULSEa through SET_CON_PULSEd. Therefore, the example of FIG. 28, the slope height SL is the same for each of the current control signals SET_CON_PULSEa through SET_CON_PULSEd. Therefore, under the conditions of this example, the current control signal SET_CON_PULSEa with the smallest pulse width SW has the greatest pulse slope SL/SW, while the current control signal SET_CON_PULSEd with the largest pulse width SW has the smallest pulse slope SL/SW.

According to the embodiment of FIG. 28, over-programming of memory cells of a block is avoided during a set write operation by applying a set sloped pulse current control signal having a relative greater slope and a relatively shorter pulse width to the far block 260a. This has a similar effect as that of the embodiment of previously described FIG. 9.

Another embodiment will now be described with reference to FIG. 29.

Figure 29:
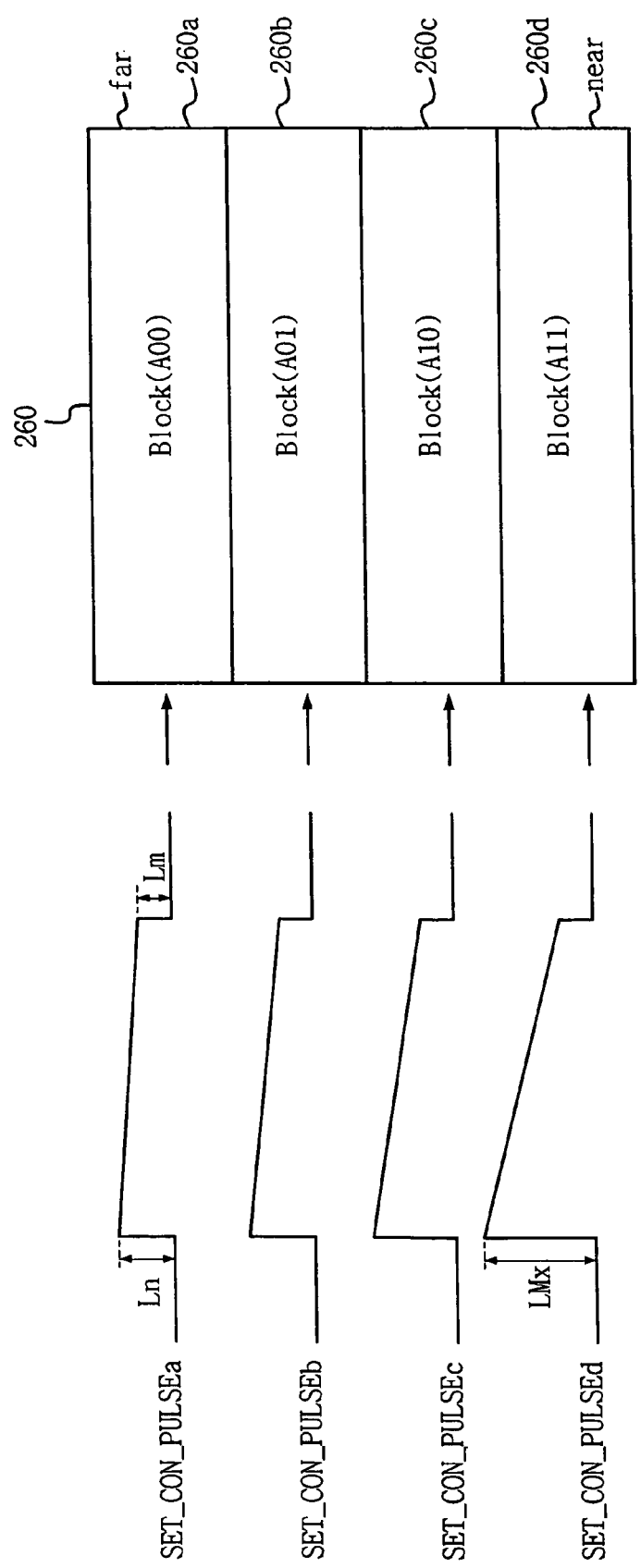
FIG. 29 illustrates set programming pulses applied to the phase-change memory cell blocks according to yet another embodiment of the invention.

FIG. 29 illustrates set sloped pulse current control signals SET_CON_PULSEa through SET_CON_PULSEd having constant pulse widths but different pulse slopes. In this example, the control signal SET_CON_PULSEa has the lowest front end pulse height Ln, while the control signal SET_CON_PULSEd has the highest front end pulse height LMx. Each of the control signals SET_CON_PULSEa through SET_CON_PULSEd has the same terminating end pulse height Lm. Accordingly, the control signal SET_CON_PULSEa has the smallest pulse slope, whereas the control signal SET_CON_PULSEd has the greatest pulse slope. The set sloped pulse current control signals SET_CON_PULSEa through SET_CON_PULSEd are applied to generate corresponding set currents to the respective blocks 260a, 260b, 260c and 260d of the phase-change memory cell array 260.

According to the embodiment of FIG. 29, over-programming of memory cells of a block is avoided during a set write operation by applying a set sloped pulse current control signal having a relative smaller slope and a same pulse width to the far block 260a. This has a similar effect as that of the embodiment of previously described FIG. 9.

Another embodiment of the invention will now be described with reference to FIG. 30.

Figure 30:
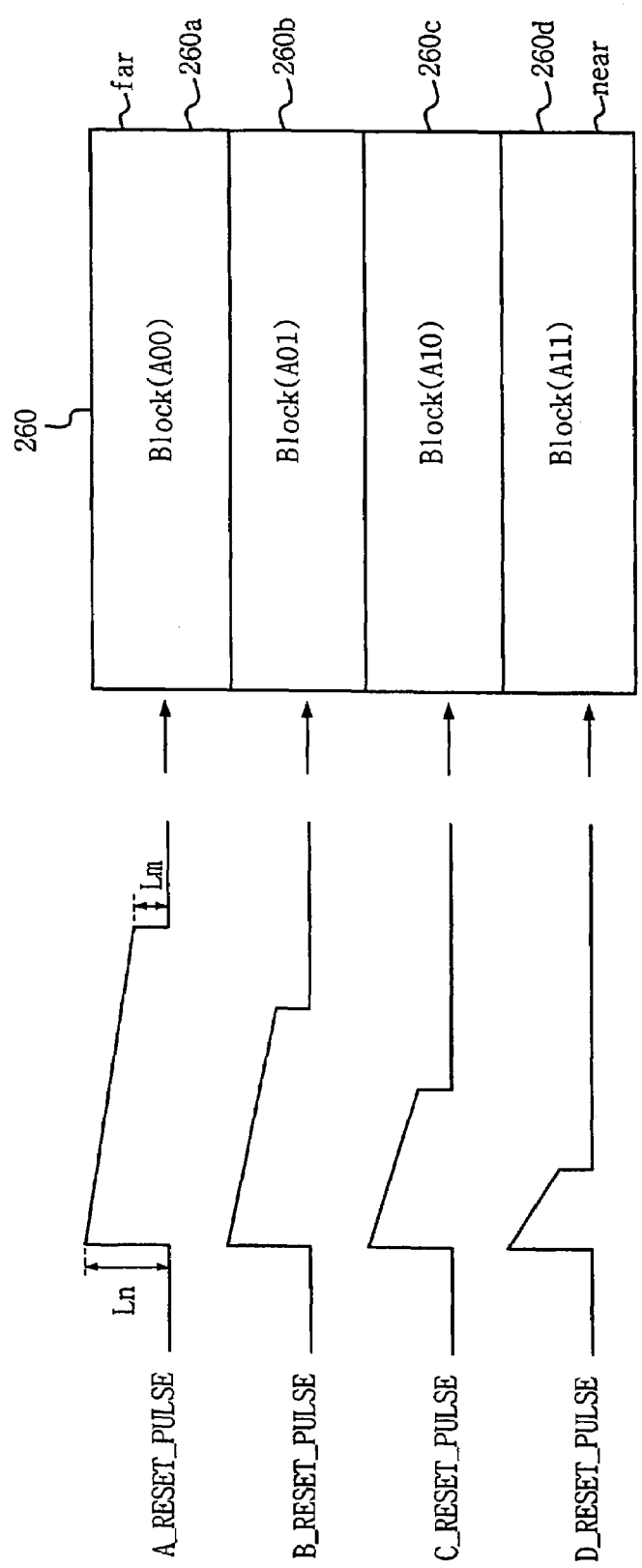
FIG. 30 illustrates reset programming pulses applied to phase-change memory cell blocks according to another embodiment of the invention.

FIG. 30 illustrates RESET sloped pulse current control signals RESET_CON_PULSEa through RESET_CON_PULSEd having respectively different pulse widths and different pulse slopes. Similar to the embodiment of FIG. 24, the reset sloped pulse current control signals RESET_CON_PULSEa through RESET_CON_PULSEd of FIG. 30 are applied to respective blocks 260a, 260b, 260c and 260d of the phase-change memory cell array 260. As shown in FIG. 30, a pulse width of the signal input to a far block 260a is greater than a pulse width of the signal input to a near block 260d, and also a pulse slope of signal input to the far block 260a is less than a pulse slope of the signal input to the near block 260d.

In the example of FIG. 30, the terminating pulse height Lm is the same for each of the current control signals RESET_CON_PULSEa through RESET_CON_PULSEd. Likewise, the beginning pulse height Ln is the same for each of the current control signals RESET_CON_PULSEa through RESET_CON_PULSEd. Therefore, under the conditions of this example, the current control signal RESET_CON_PULSEa with the greatest pulse width has the smallest pulse slope, whereas the current control signal RESET_CON_PULSEd with the smallest pulse width has the largest pulse slope.

Another embodiment of the invention will now be described with reference to FIG. 31.

Figure 31:
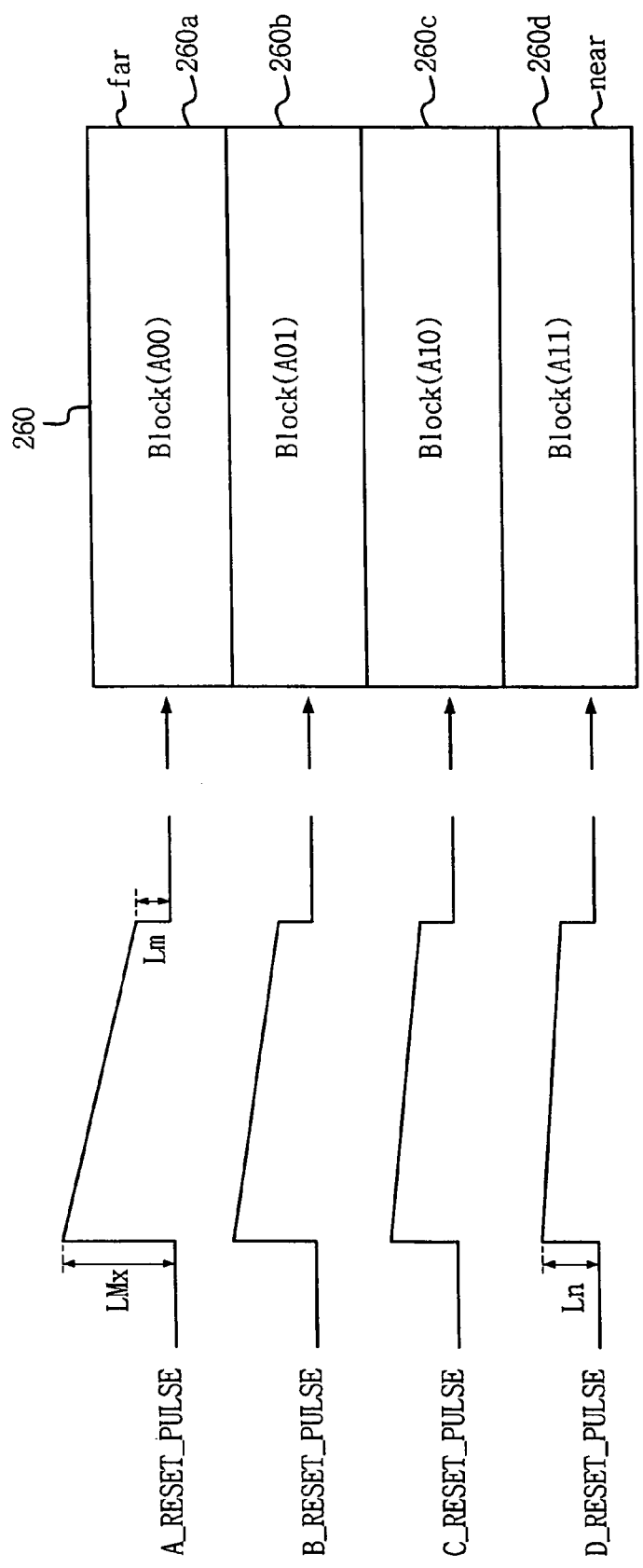
FIG. 31 illustrates reset programming pulses applied to phase-change memory cell blocks according to still another embodiments of the invention.

FIG. 31 illustrates reset sloped pulse current control signals RESET_CON_PULSEa through RESET_CON_PULSEd having constant pulse widths but different pulse slopes. In this example, the control signal RESET_CON_PULSEa has the greates front end pulse height LMx, while the control signal RESET_CON_PULSEd has the smallest front end pulse height Ln. Each of the control signals RESET_CON_PULSEa through RESET_CON_PULSEd has the same terminating end pulse height Lm. Accordingly, the control signal RESET_CON_PULSEa has the greatest pulse slope, whereas the control signal RESET_CON_PULSEd has the smallest pulse slope. The set sloped pulse current control signals RESET_CON_PULSEa through RESET_CON_PULSEd are applied to generate corresponding set currents to the respective blocks 260a, 260b, 260c and 260d of the phase-change memory cell array 260.

Figure 32:
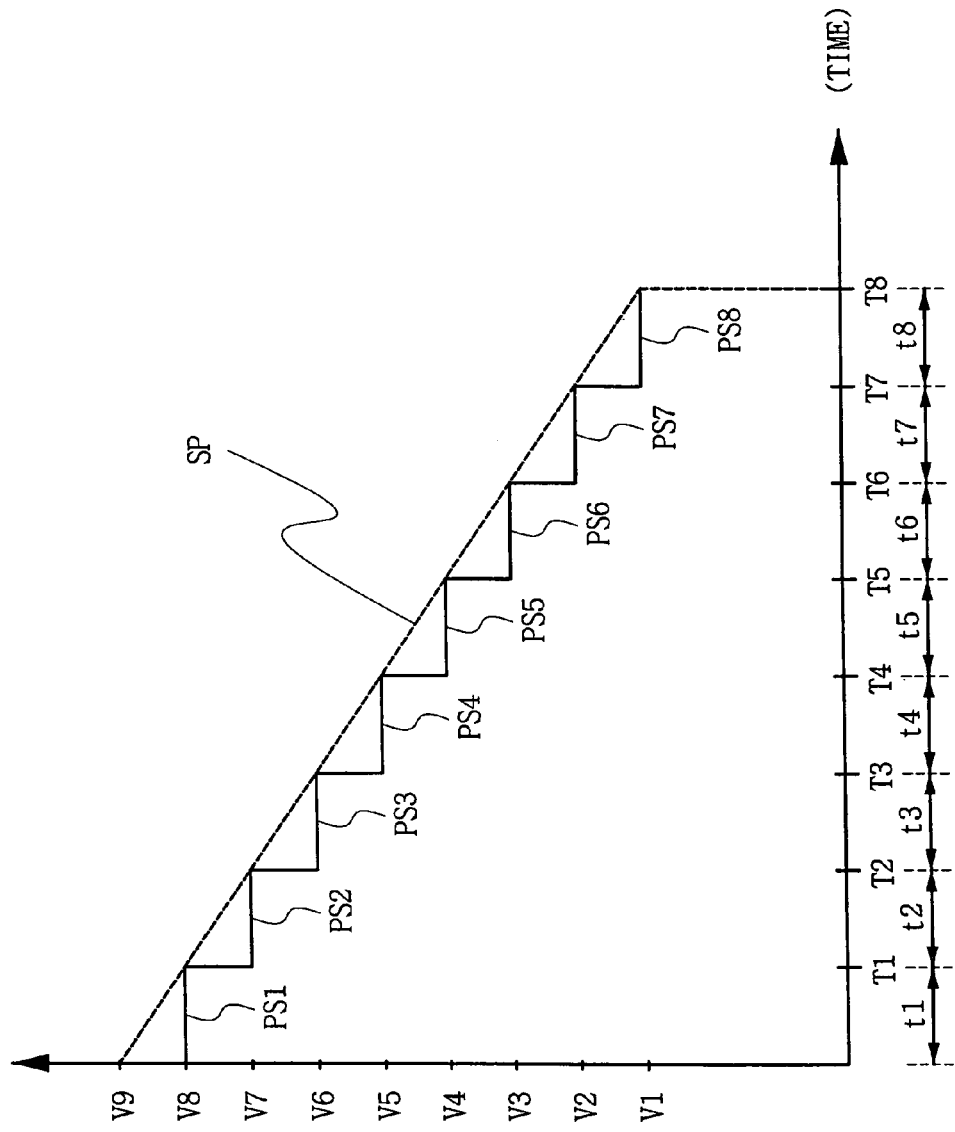
FIG. 32 is a graph of step voltage waveforms used to generate pulses shown in FIGS. 28 and 31.

In the examples illustrated in FIGS. 28 through 31, the pulse slopes are shown as being linear. However, it is also possible to form each pulse slope in a non-linear manner such as, for example, according a step-function. FIG. 32 is a graph of step voltage waveforms which may be used to generate the pulse slopes of FIG. 28 through 31.

Referring to FIG. 32, a pulse slope SP is defined by a plurality of step pulses PS1, PS2, ..., PS7, PS8. In particular, a pulse current PS1 corresponding to a voltage level V8 is output during a time period t1, a pulse current PS2 corresponding to a voltage level V7 is output during a time period t2, and so on until a final pulse current PS8 corresponding to a voltage level V1 is output during a time period t8.

In FIG. 32, the pulse slope is provided as combination of unit pulses which define a step-function. However, other methods may be adopted to obtain a pulse slope, such as analog methods employing RC delay circuits.

Figure 33:
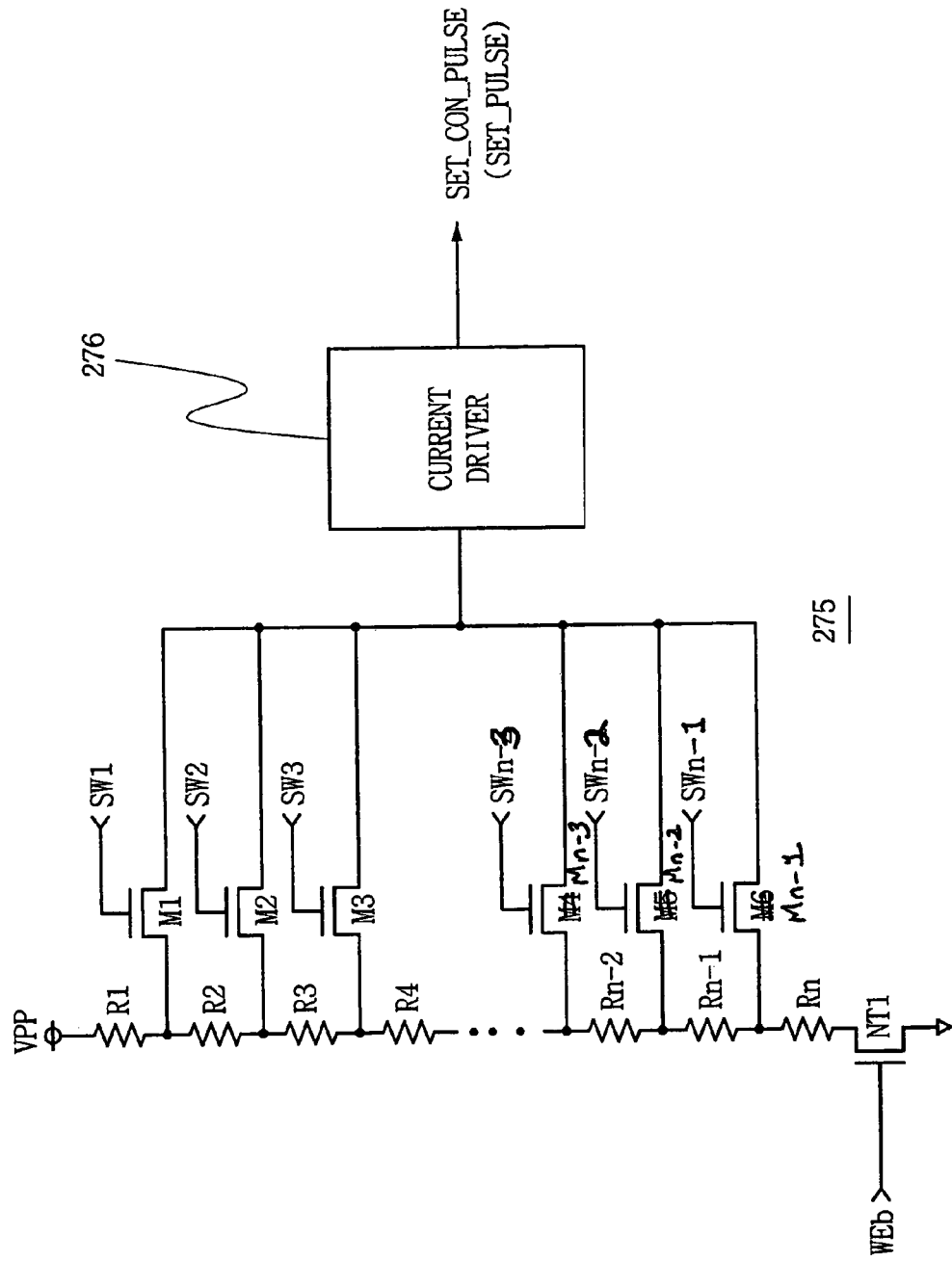
FIG. 33 is a circuit diagram illustrating an example of a slope pulse generator used to generate a slope pulse shown in FIG. 32.

FIG. 33 illustrates an example of pulse slope generator which may be used to generate a pulse slope such at that shown in FIG. 32. Referring to FIG. 33, the slope pulse generator of this example includes a multi-voltage level generator 275 and a current driver 276. The multi-voltage level generator 275 is constructed of voltage-divided resistances R1 through Rn which divide a drive voltage VPP into a plurality of voltage levels. Generally, the drive voltage VPP may be a boosted voltage which is higher than a general operating voltage of a semiconductor memory device. The multi-voltage level generator 275 further includes switching transistors M1 through Mn−1 connected between the current driver 276 and connection nodes of the resistances R1 through Rn as shown in FIG. 33. The transistors M1 through Mn−1 are respectively gated to receive switching signals SW1 through SWn−1. M6. The current driver 276 outputs a current SET_CON_PULSE (or SET_PULSE) according to a voltage applied from the multi-voltage generator 275.

For example, the switching transistor M1 may be turned on during time period t1 of FIG. 32 to apply a voltage level V8 to the current driver 276, and a corresponding current may then be output from the current driver 276. Then, the switching transistor M2 may be turned on during time period t2 of FIG. 32 to apply a voltage level V7 to the current driver 276, and a corresponding current may then be output from the current driver 276. This process is then repeated for time periods t3 through t8 with respect to some or all of the remaining switching transistors so as to obtain the pulse slope illustrated in FIG. 32.

The slope of the SET and REST pulse currents depends upon the multiplexing speed of the slope pulse generator, that is, the turn-on periods of switching transistors M1 through Mn−1.

Figure 1:
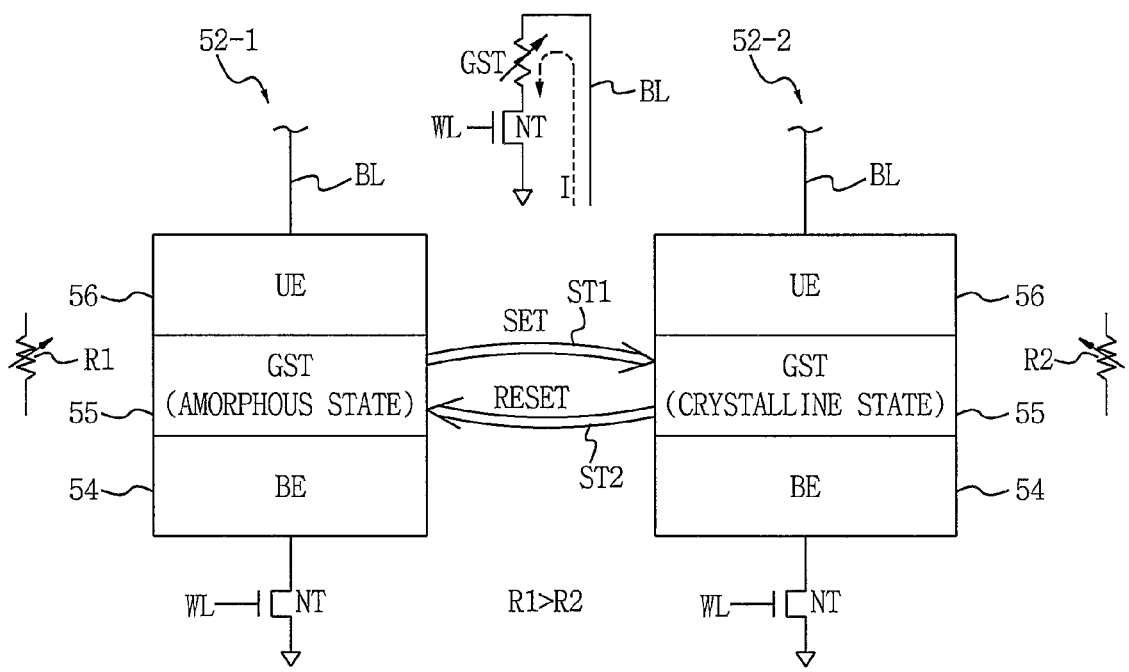
FIG. 1 is an illustration of a phase-change memory cell in an amorphous state and a crystalline state.
Figure 2:
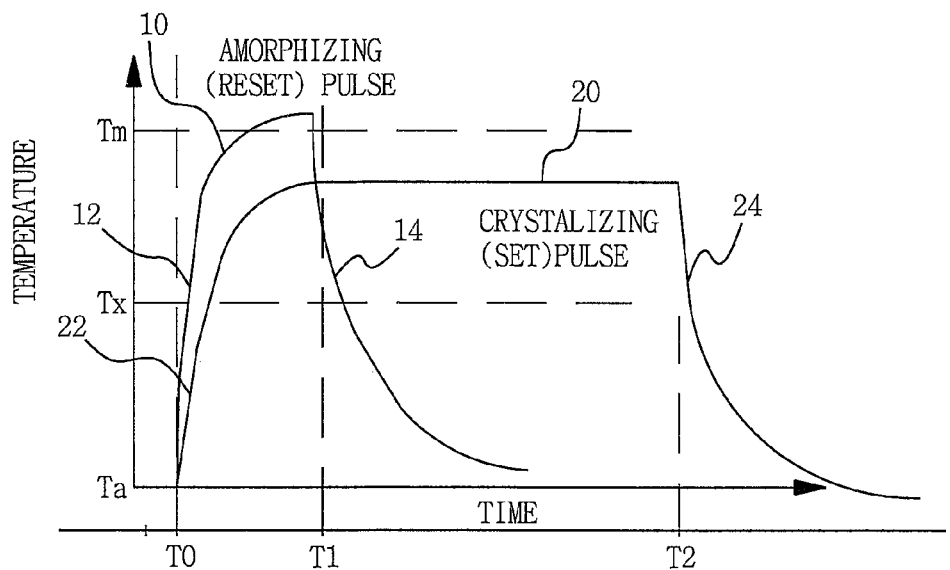
FIG. 2 is a graph illustrating the temperature characteristics of a phase-change memory cell in response to a reset programming signal and a set programming signal.
Figure 3:
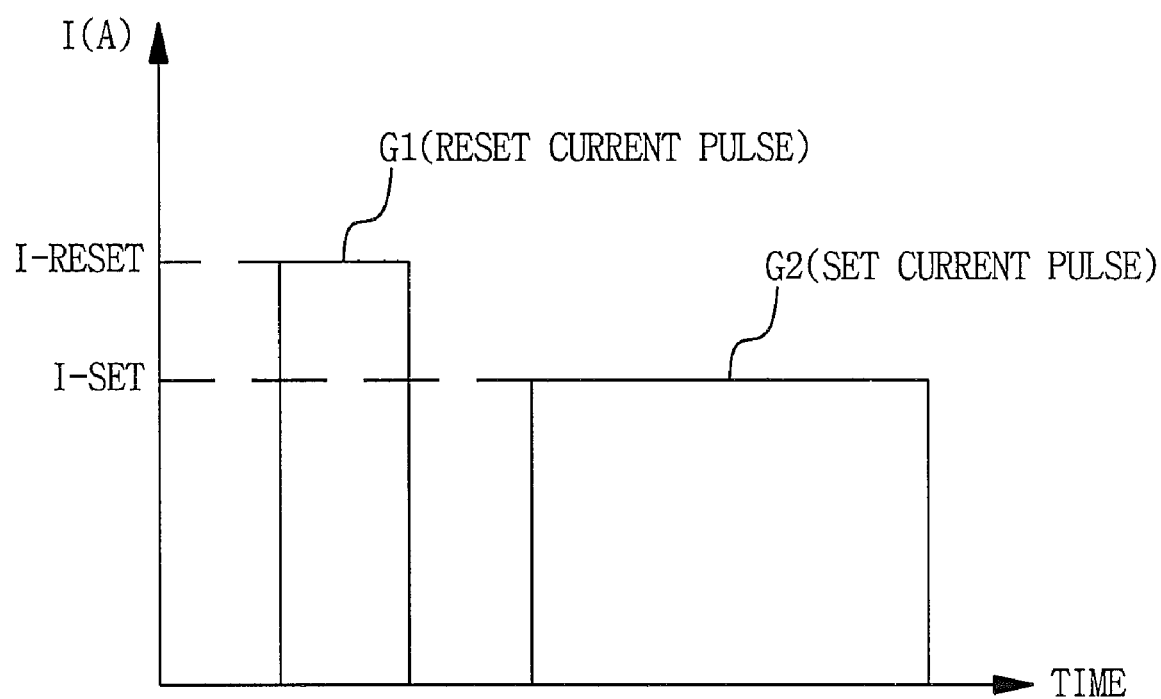
FIG. 3 is a graph illustrating the write current pulses of a reset programming signal and a set programming signal.
Figure 4:
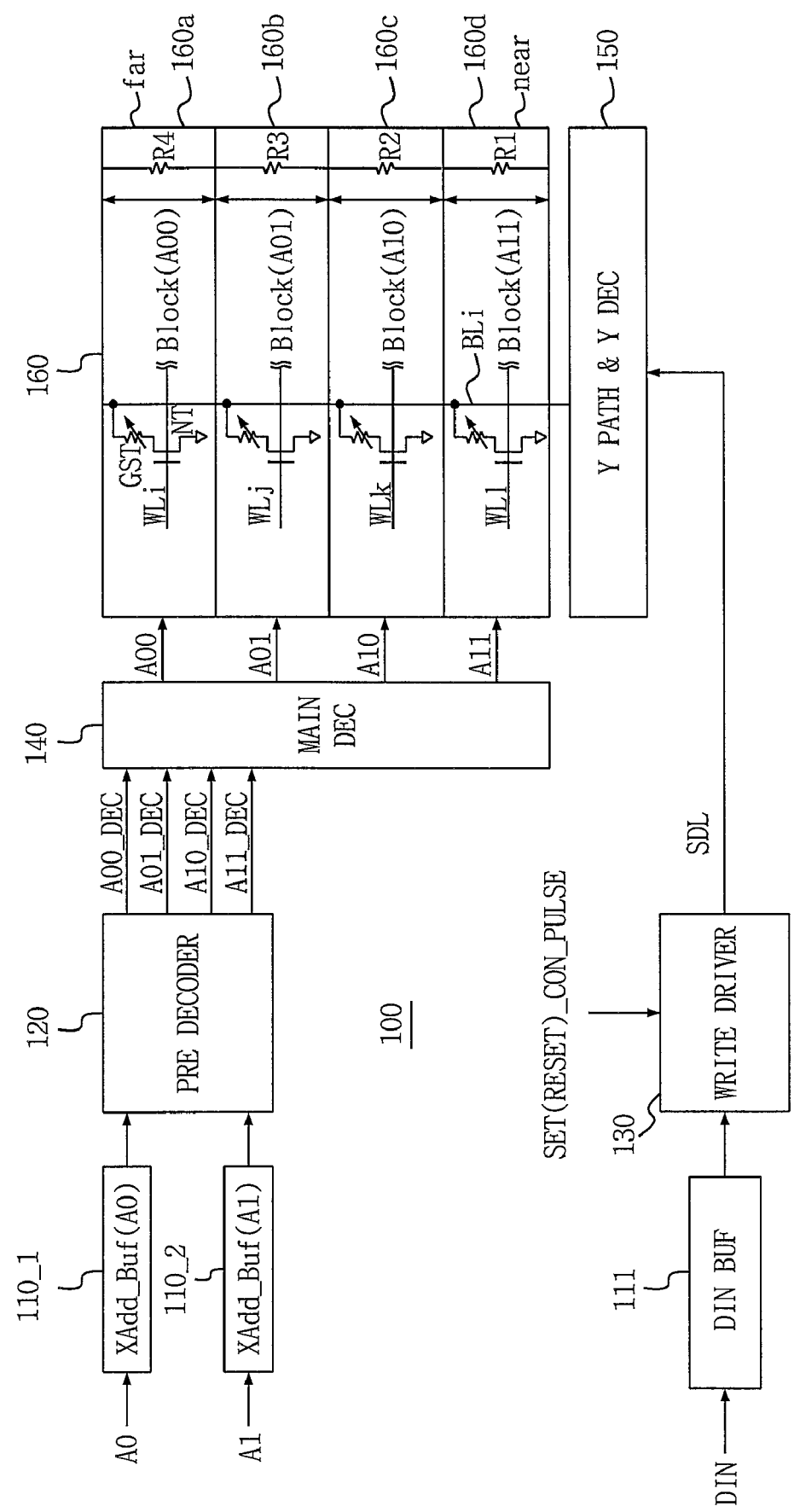
FIG. 4 is a circuit diagram of a phase-change memory cell device.
Figure 5:
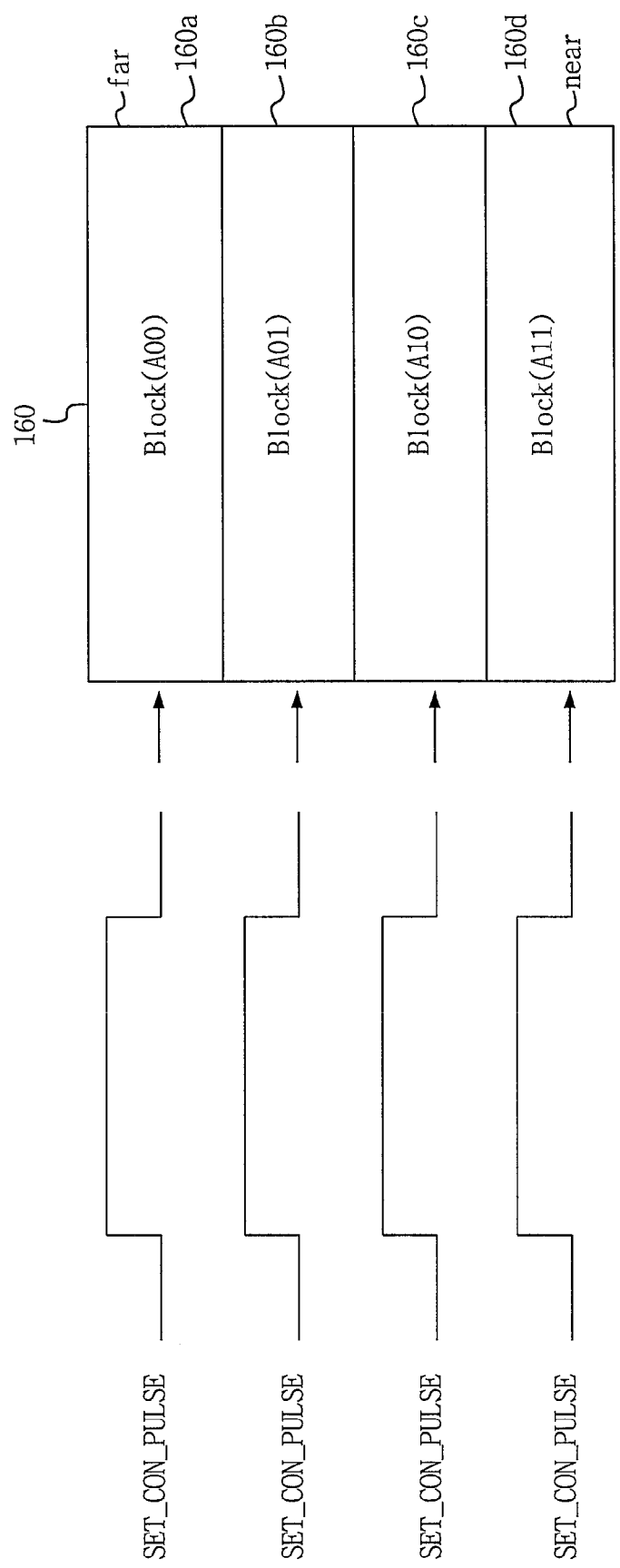
FIG. 5 illustrates set programming pulses applied to the phase-change memory cell blocks.
Figure 6:
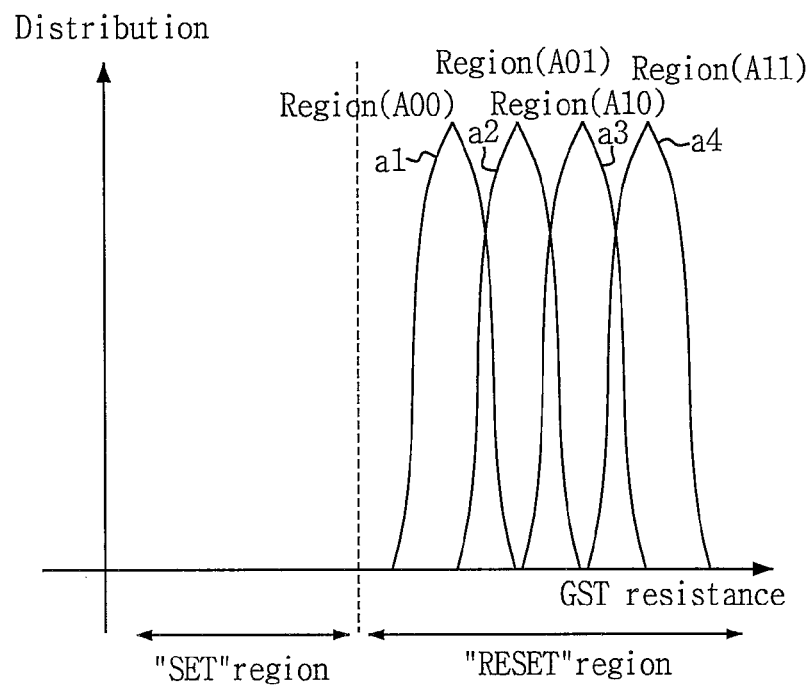
FIG. 6 illustrates RESET resistance distribution regions of phase-change memory cells in different memory blocks.

Referring back to FIG. 1, in the phase-change memory cell, a variable resistance formed of one phase-change material such as GST and an access transistor constructed of an N-type MOS transistor NT constitute a unit memory cell. The access transistor may be herein replaced with a diode ID like that shown in FIG. 34. The diode constitutes one unit memory cell, with phase-change material, and serves as an isolation device and a one-side switching device.

Figure 34:
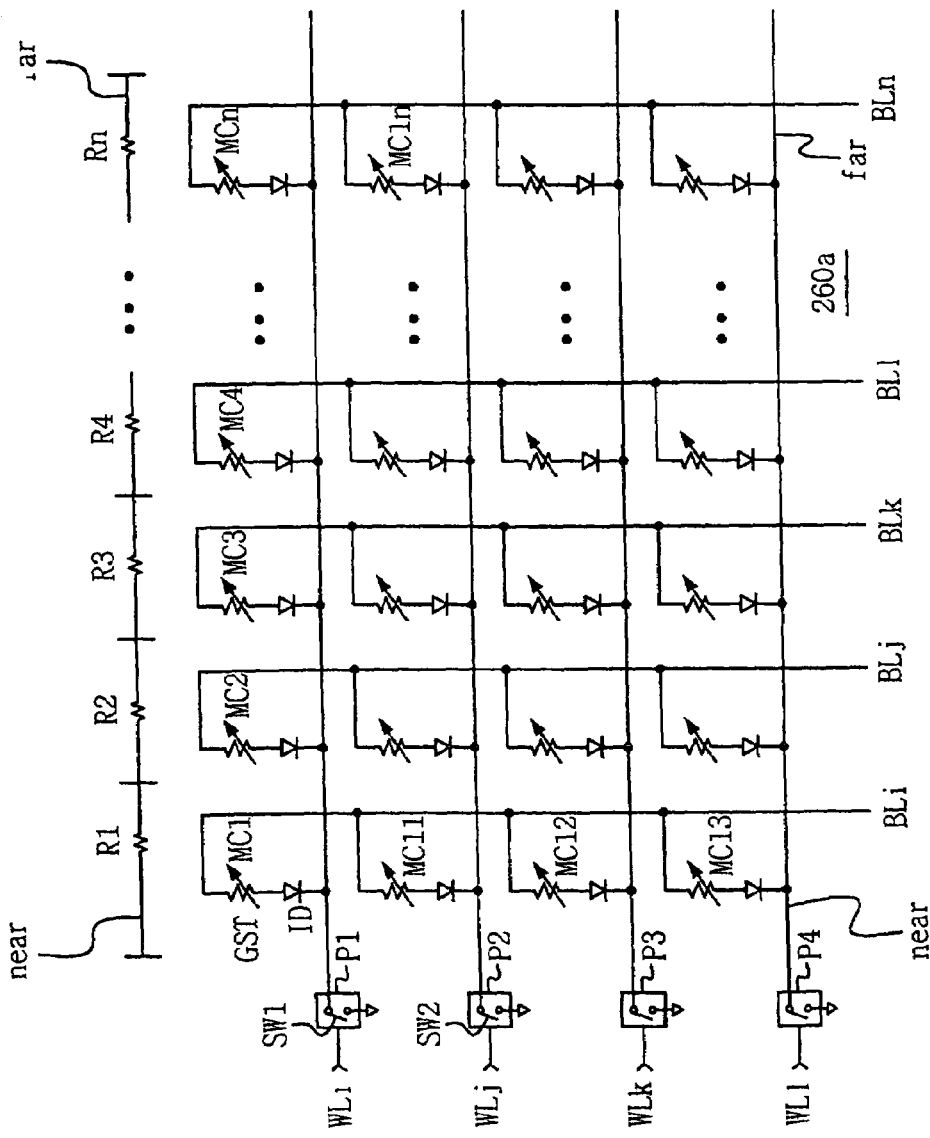
FIG. 34 indicates a word line load difference between cells in a phase-change memory cell array constructed of phase-change memory cells formed of a phase-change material, such as a chalcogenide alloy (GST), and a diode.

FIG. 34 indicates a word line load difference between cells in a phase-change memory cell array constructed of phase-change memory cells formed of a phase-change material such as GST and a diode. In an optional word line WLi of word lines Wli, WLj, WLk and WLl provided in a memory cell array 260a, a memory cell MC1 coupled to a bit line Bli is nearer to a discharge device P1 as compared with a memory cell MC4 connected to a bit line BL1. Consequently, a word line resistance of the memory cell MC4 is large as compared with that of the memory cell MC1. In the memory cell array employing a diode as shown in FIG. 34, when word line loading levels between memory cells connected to the same word line are different from each other, solutions against a fail of programming operation are required. In particular, in the memory cell array like in FIG. 34, the discharge device P1 that may be constructed of MOS transistor, is switched by a word line signal, thus considering the word line load is more required as compared with a bit line load.

Figure 35:
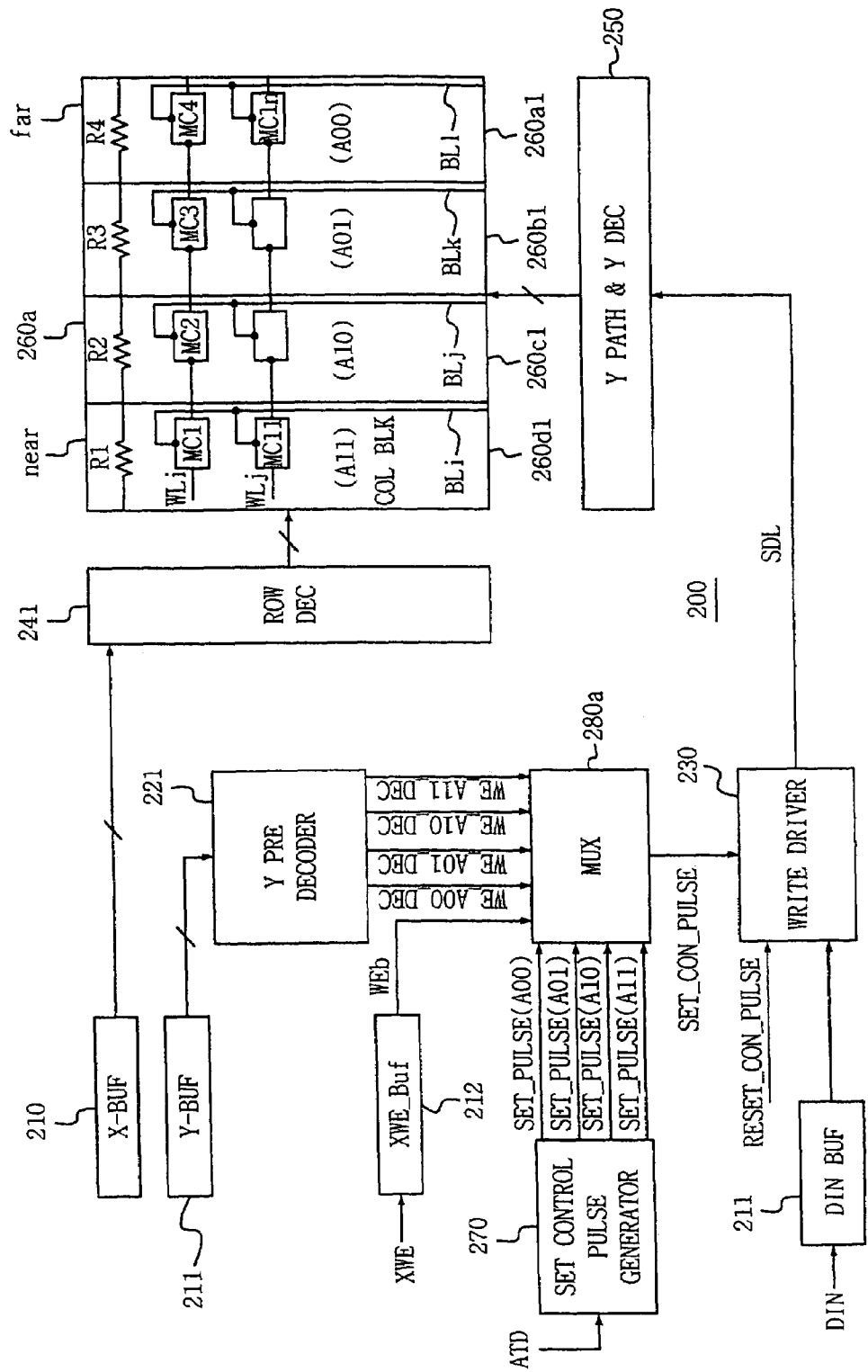
FIG. 35 is a block diagram for write operation to substantially reduce a resistance distribution of phase-change memory cells in employing the memory cell array of FIG. 34 according to an embodiment of the invention.

A block diagram of FIG. 35 is proposed as other embodiment varied from FIG. 8, in order to solve a program fail problem based on the word line load described above with reference to FIG. 34. FIG. 35 is a block diagram for write operation to substantially reduce a resistance distribution of phase-change memory cells in employing the memory cell array of FIG. 34 according to an embodiment of the invention. FIG. 35 provides a characteristic of generating set current control signals by using a column address so as to reduce the resistance distribution between memory cells based on the word line load difference. Thus, a multiplexer 280*a* is configured to apply a column predecoding output signal of a column predecoder 221.

Figure 36:
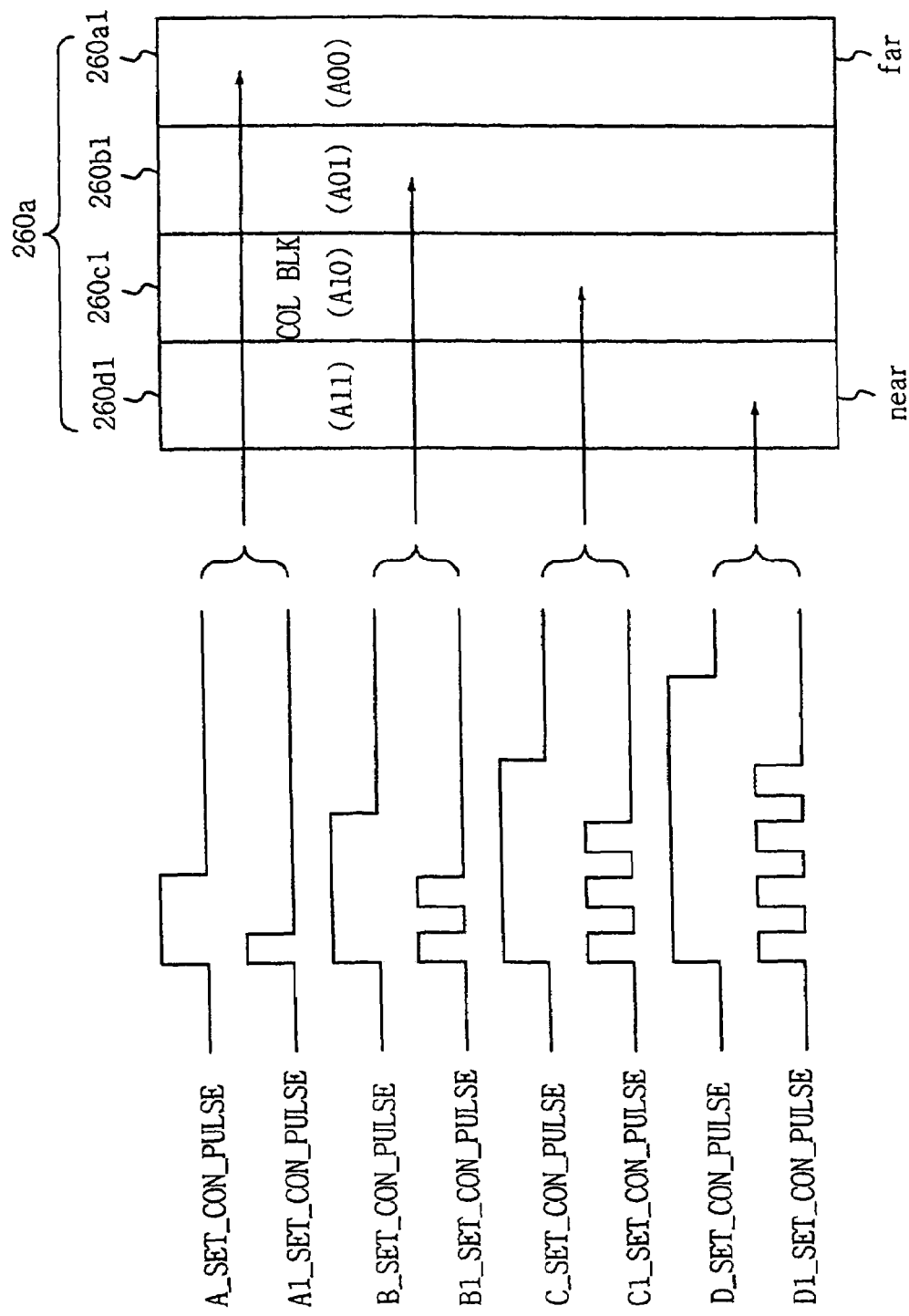
FIG. 36 illustrates set programming pulses differentially applied per column block of a memory cell array in a write operation of a device shown in FIG. 35.

FIG. 36 illustrates set programming pulses differentially applied per column block of a memory cell array in a write operation of a device shown in FIG. 35. With reference to FIG. 36, set current control signals (A_SET_CON_PULSE, B_SET_CON_PULSE, C_SET_CON_PULSE, D_SET_CON_PULSE, A1_SET_CON_PULSE, B1_SET_CON_PULSE, C1_SET_CON_PULSE and D1_SET_CON_PULSE), which individually have different pulse widths and pulse number, are applied each corresponding to column blocks A11, A10, A01 and A00 of the memory cell array 260*a*. One column block may have a plurality of bit lines, and memory cells having similar word line loading values. Thus, when the memory cells connected with different word lines belong to the same column group, they may become the same column block. As shown in FIG. 36, from a column direction basis, a pulse width of set current signal applied to a far block 260*a*1 is shorter than a pulse width of set current signal applied to a near block 260*d*1, and the number of pulses thereof is less than the number of pulses of set current signal applied to the near block 260*d*1. The block-differential applying scheme of the set current signal shown in FIG. 36, performed under a state a reset current signal is constant, is provided to prevent an over-programming of memory cells belonging to a corresponding bock during a set write operation.

Figure 37:
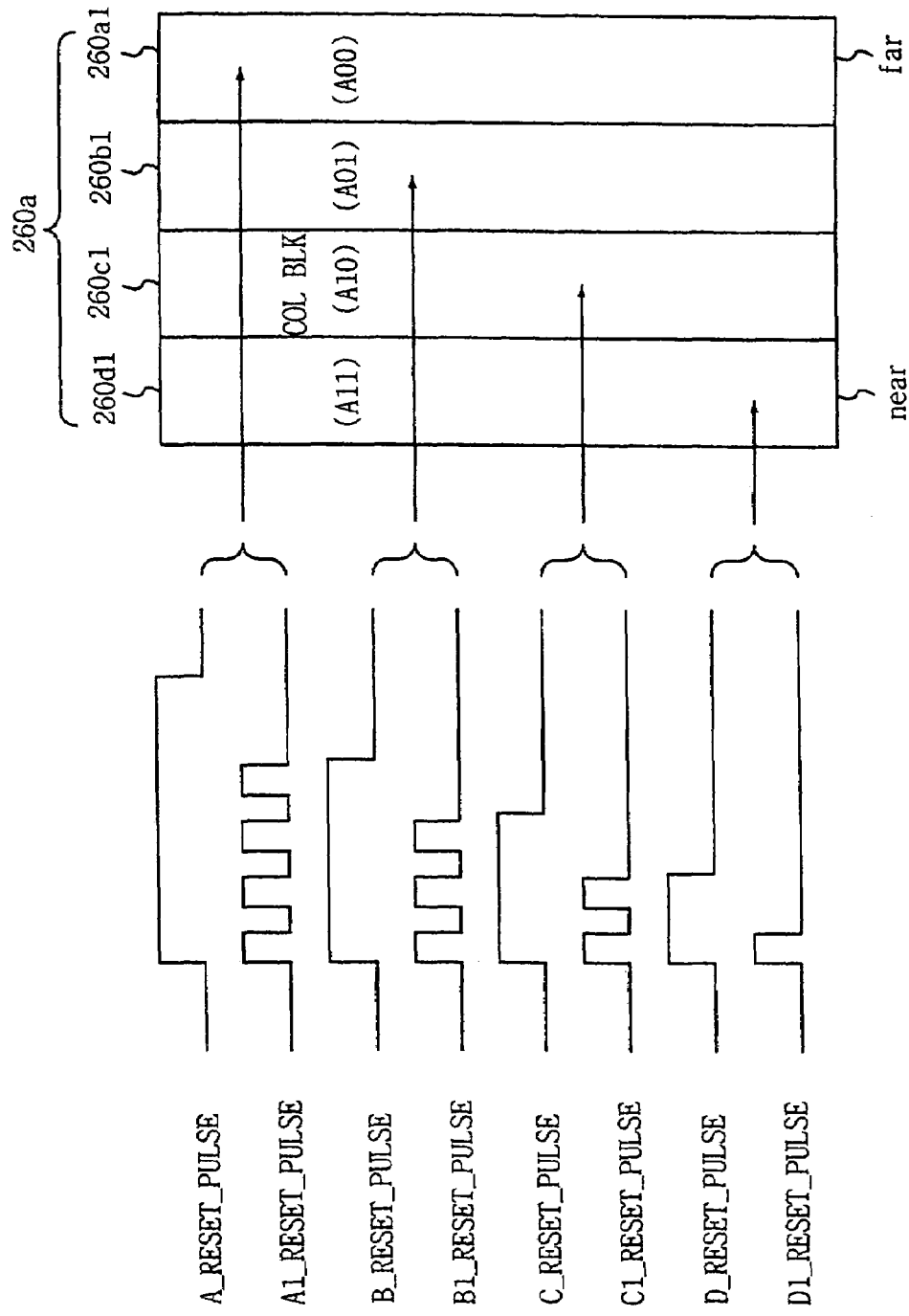
FIG. 37 illustrates reset programming pulses differentially applied per column block of the memory cell array in a write operation of the device shown in FIG. 35.

As a contrary concept to that of FIG. 36, if the set current signal has a constant state, reset current signals may be differentially applied per column block. Such scheme is shown in FIG. 37. FIG. 37 illustrates reset programming pulses differentially applied per column block of memory cell array in a write operation of the device shown in FIG. 35. On the contrary to FIG. 36, from a column direction basis, a pulse width of reset current signal applied to far block 260*a*1 is longer than a pulse width of reset current signal applied to near block 260*d*1, and the number of pulses thereof is more than that of reset current signal applied to the near block 260*d*1.

FIG. 38 illustrates set programming pulses of a slope pulse type differentially applied per column block of memory cell array in a write operation of the device shown in FIG. 35. In FIG. 38, any one of a slope pulse width and a slope pulse level of a set slope pulse current is varied under a state the reset slope pulse current is constant. When the slope pulse width is varied, relatively a slope pulse having a relatively short pulse width is applied to a column block 260*a*1 belonging to far block. Meanwhile, when a level of the slope pulse is varied, relatively a slope pulse having a relatively low pulse level is applied to column block 260*a*1 belonging to far block. The pulse width is herein fixed as a constant width when the slope pulse level is varied.

FIG. 39 illustrates reset programming pulses of a slope pulse type differentially applied per column block of the memory cell array in a write operation of the device shown in FIG. 35. In FIG. 39, any one of a slope pulse width and a slope pulse level of a reset slope pulse current is varied under a state the set slope pulse current is constant. When the reset slope pulse width is varied, relatively a reset slope pulse having a relatively long pulse width is applied to column block 260*a*1 belonging to far block. Meanwhile, when a level of the reset slope pulse is varied, relatively a reset slope pulse having a relatively high pulse level as compared with near column block 260*d*1 is applied to column block 260*a*1 belonging to far block.

In employing a memory cell constructed of a variable resistance and a diode it is required to significantly consider a word line loading. As described above, a column address is detected, considering a word line load of a selected memory cell, and a differential program per column block is performed, thereby substantially reducing a current consumption in a write operation and lessening a resistance distribution.

It is noted that combinations of the above-described embodiments may also be implemented. For example, the pulse width and/or pulse count and/or pulse slope of both the RESET and SET write current pulses may be varied according to the load of the phase-change memory cell being written.

In the drawings and specification there have been disclosed embodiments of the present invention, including specific examples. This discussion is used in a generic and descriptive sense only and not purpose of limitation. It should be therefore understood that this invention is to be construed by the appended claims and not by the exemplary embodiments. Further, one of ordinary skill in the art would deviate from this disclosure without departing from the spirit and scope of the embodiments of the present invention.

What is claimed is:

1. A phase-change cell memory device, comprising:
a plurality of phase-change memory cells each including a volume of material programmable between amorphous and crystalline states;
an address circuit for selecting at least one of the memory cells;
a write driver for generating a reset sloped pulse current to program a memory cell selected by the address circuit into the amorphous state, and generating a set sloped pulse current to program the memory cell selected by the address circuit into the crystalline state; and
a write driver control circuit coupled to the address circuit, the write driver control circuit for varying at least one of a pulse width and pulse slope of at least one of the reset and set sloped pulse currents according to a load between the write driver and the memory cell selected by the address circuit,
wherein the write driver control circuit varies a pulse width of at least one of the reset and set slope pulse currents, and
wherein the pulse width of the reset sloped pulse current is constant, and wherein the write driver control circuit decreases a pulse width of the set sloped pulse current with an increase in load between the write driver and the memory cells selected by the address circuit.

2. A phase-change cell memory device, comprising:
a plurality of phase-change memory cells each including a volume of material programmable between amorphous and crystalline states;
an address circuit for selecting at least one of the memory cells;
a write driver for generating a reset sloped pulse current to program a memory cell selected by the address circuit into the amorphous state, and generating a set sloped pulse current to program the memory cell selected by the address circuit into the crystalline state; and
a write driver control circuit coupled to the address circuit, the write driver control circuit for varying at least one of a pulse width and pulse slope of at least one of the reset and set sloped pulse currents according to a load between the write driver and the memory cell selected by the address circuit, wherein the write driver control circuit varies a pulse width of at least one of the reset and set slope pulse currents, and wherein the pulse width of the set sloped pulse current is constant, and wherein the write driver control circuit decreases a pulse width of the reset sloped pulse current with an increase in load between the write driver and the memory cells selected by the address circuit.

3. A phase-change cell memory device, comprising:

a plurality of phase-change memory cells each including a volume of material programmable between amorphous and crystalline states;

an address circuit for selecting at least one of the memory cells;

a write driver for generating a reset sloped pulse current to program a memory cell selected by the address circuit into the amorphous state, and generating a set sloped pulse current to program the memory cell selected by the address circuit into the crystalline state; and a write driver control circuit coupled to the address circuit, the write driver control circuit for varying at least one of a pulse width and pulse slope of at least one of the reset and set sloped pulse currents according to a load between the write driver and the memory cell selected by the address circuit, wherein the write driver control circuit varies a pulse width of at least one of the reset and set slope pulse currents, and wherein the pulse width of the reset sloped pulse current is constant, and wherein the write driver control circuit increases a pulse width of the set sloped pulse current with an increase in load between the write driver and the memory cells selected by the address circuit.

4. A phase-change cell memory device, comprising:

a plurality of phase-change memory cells each including a volume of material programmable between amorphous and crystalline states;

an address circuit for selecting at least one of the memory cells;

a write driver for generating a reset sloped pulse current to program a memory cell selected by the address circuit into the amorphous state, and generating a set sloped pulse current to program the memory cell selected by the address circuit into the crystalline state; and a write driver control circuit coupled to the address circuit, the write driver control circuit for varying at least one of a pulse width and pulse slope of at least one of the reset and set sloped pulse currents according to a load between the write driver and the memory cell selected by the address circuit, wherein the write driver control circuit varies a pulse width of at least one of the reset and set slope pulse currents, wherein the pulse width of the set sloped pulse current is constant, and wherein the write driver control circuit increases a pulse width of the reset sloped pulse current with an increase in load between the write driver and the memory cells selected by the address circuit.

5. A phase-change cell memory device, comprising:

a plurality of phase-change memory cells each including a volume of material programmable between amorphous and crystalline states;

an address circuit for selecting at least one of the memory cells;

a write driver for generating a reset sloped pulse current to program a memory cell selected by the address circuit into the amorphous state, and generating a set sloped pulse current to program the memory cell selected by the address circuit into the crystalline state; and a write driver control circuit coupled to the address circuit, the write driver control circuit for varying at least one of a pulse width and pulse slope of at least one of the reset and set sloped pulse currents according to a load between the write driver and the memory cell selected by the address circuit, wherein the write driver control circuit varies a pulse width of at least one of the reset and set slope pulse currents, wherein the write driver control circuit increases a pulse width of the set and reset sloped pulse currents with an increase in load between the write driver and the memory cells selected by the address circuit.

6. A phase-change cell memory device, comprising:

a plurality of phase-change memory cells each including a volume of material programmable between amorphous and crystalline states;

an address circuit for selecting at least one of the memory cells;

a write driver for generating a reset sloped pulse current to program a memory cell selected by the address circuit into the amorphous state, and generating a set sloped pulse current to program the memory cell selected by the address circuit into the crystalline state; and a write driver control circuit coupled to the address circuit, the write driver control circuit for varying at least one of a pulse width and pulse slope of at least one of the reset and set sloped pulse currents according to a load between the write driver and the memory cell selected by the address circuit, wherein the write driver control circuit varies a pulse slope of at least one of the reset and set slope pulse currents, and wherein the pulse slope of the reset sloped pulse current is constant, and wherein the write driver control circuit decreases a pulse slope of the set sloped pulse current with an increase in load between the write driver and the memory cells selected by the address circuit.

7. A phase-change cell memory device, comprising:

a plurality of phase-change memory cells each including a volume of material programmable between amorphous and crystalline states;

an address circuit for selecting at least one of the memory cells;

a write driver for generating a reset sloped pulse current to program a memory cell selected by the address circuit into the amorphous state, and generating a set sloped pulse current to program the memory cell selected by the address circuit into the crystalline state; and a write driver control circuit coupled to the address circuit, the write driver control circuit for varying at least one of a pulse width and pulse slope of at least one of the reset and set sloped pulse currents according to a load between the write driver and the memory cell selected by the address circuit, wherein the write driver control circuit varies a pulse slope of at least one of the reset and set slope pulse currents, and wherein the pulse slope of the set sloped pulse current is constant, and wherein the write driver control circuit decreases a pulse slope of the reset sloped pulse current with an increase in load between the write driver and the memory cells selected by the address circuit.

8. A phase-change cell memory device, comprising:
a plurality of phase-change memory cells each including a volume of material programmable between amorphous and crystalline states;
an address circuit for selecting at least one of the memory cells;
a write driver for generating a reset sloped pulse current to program a memory cell selected by the address circuit into the amorphous state, and generating a set sloped pulse current to program the memory cell selected by the address circuit into the crystalline state; and
a write driver control circuit coupled to the address circuit, the write driver control circuit for varying at least one of a pulse width and pulse slope of at least one of the reset and set sloped pulse currents according to a load between the write driver and the memory cell selected by the address circuit,
wherein the write driver control circuit varies a pulse slope of at least one of the reset and set slope pulse currents, and
wherein the pulse slope of the reset sloped pulse current is constant, and wherein the write driver control circuit increases a pulse slope of the set sloped pulse current with an increase in load between the write driver and the memory cells selected by the address circuit.

9. A phase-change cell memory device, comprising:
a plurality of phase-change memory cells each including a volume of material programmable between amorphous and crystalline states;
an address circuit for selecting at least one of the memory cells;
a write driver for generating a reset sloped pulse current to program a memory cell selected by the address circuit into the amorphous state, and generating a set sloped pulse current to program the memory cell selected by the address circuit into the crystalline state; and
a write driver control circuit coupled to the address circuit, the write driver control circuit for varying at least one of a pulse width and pulse slope of at least one of the reset and set sloped pulse currents according to a load between the write driver and the memory cell selected by the address circuit,
wherein the write driver control circuit varies a pulse slope of at least one of the reset and set slope pulse currents, and
wherein the pulse slope of the set sloped pulse current is constant, and wherein the write driver control circuit increases a pulse slope of the reset sloped pulse current with an increase in load between the write driver and the memory cells selected by the address circuit.

10. A phase-change cell memory device, comprising:
a plurality of phase-change memory cells each including a volume of material programmable between amorphous and crystalline states;
an address circuit for selecting at least one of the memory cells;
a write driver for generating a reset sloped pulse current to program a memory cell selected by the address circuit into the amorphous state, and generating a set sloped pulse current to program the memory cell selected by the address circuit into the crystalline state; and
a write driver control circuit coupled to the address circuit, the write driver control circuit for varying at least one of a pulse width and pulse slope of at least one of the reset and set sloped pulse currents according to a load between the write driver and the memory cell selected by the address circuit,
wherein the write driver control circuit varies a pulse slope of at least one of the reset and set slope pulse currents, and
wherein the write driver control circuit increases a pulse slope of the set and reset sloped pulse currents with an increase in load between the write driver and the memory cells selected by the address circuit.

11. A phase-change cell memory device, comprising:
a plurality of phase-change memory cells each including a volume of material programmable between amorphous and crystalline states;
an address circuit for selecting at least one of the memory cells;
a write driver for generating a reset sloped pulse current to program a memory cell selected by the address circuit into the amorphous state, and generating a set sloped pulse current to program the memory cell selected by the address circuit into the crystalline state;
a write driver control circuit coupled to the address circuit, the write driver control circuit for varying at least one of a pulse width and pulse slope of at least one of the reset and set sloped pulse currents according to a load between the write driver and the memory cell selected by the address circuit; and
a sloped pulse generator which generates stepped voltage signals, wherein a pulse slope of the set and reset sloped pulse currents corresponds to a speed at which the slope pulse generator generates the stepped voltage signals.

12. A phase-change cell memory device, comprising:
a plurality of memory cell blocks each including a plurality of phase-change memory cells, each of the phase-change memory cells having a volume of material programmable between amorphous and crystalline states;
an address circuit for selecting each of the memory cell blocks;
a write driver for selectively generating a reset sloped pulse current to program memory cells of a memory cell block selected by the address circuit into the amorphous set state, and a set sloped pulse current to program memory cells of the memory cell block selected by the address circuit into the crystalline state; and
a write driver control circuit for varying at least one of a pulse width and a pulse slope of at least one of the reset and set sloped pulse currents according to the memory cell block selected by the address circuit.

13. The device of claim 12, wherein the write driver control circuit varies a pulse width of at least one of the set and reset sloped pulse currents according to a load between the write driver and the memory cell block selected by the address circuit.

14. The device of claim 12, wherein the write driver control circuit varies a pulse slope of at least one of the set and reset sloped pulse currents according to the load between the write driver and the memory cell block selected by the address circuit.

15. The device of claim 12, further comprising a sloped pulse generator which generates stepped voltage signals, wherein a pulse slope of the set and reset sloped pulse currents corresponds to a speed at which the slope pulse generator generates the stepped voltage signals.

16. A phase-change cell memory device, comprising:
a phase-change memory cell array including a plurality of word lines and bit lines and a plurality of phase-change cells at respective intersection regions of the word lines and bit lines, the memory cell array being defined by a plurality of memory blocks each including at least one word line, and each of the phase-change memory cells including a volume of material programmable between amorphous and crystalline states;
an address decoder for decoding an input row address to select a word line of each memory block and to select one of the memory blocks;
a bit line selection circuit for selecting at least one bit line according to an input column address;
a write driver coupled to the bit line selection circuit, for selectively generating a reset sloped pulse current to program a memory cell at the intersection of a selected bit line and word line within the selected memory cell block into the amorphous set state, and a set sloped pulse current to program a memory cell at the intersection of the selected bit line and word line within the selected memory cell block into the crystalline state; and
a write driver control circuit for varying at least one of a pulse width and a pulse slope of at least one of the reset and set sloped pulse currents according to the memory cell block selected by the address decoder.

17. A method of programming a phase-change memory device having a plurality of phase-change memory cells, the plurality of phase-change memory cells each including a volume of material programmable between amorphous and crystalline states, the method comprising:
using a write driver to selectively generate a reset sloped pulse current to program the memory cells selected by an address circuit into the amorphous set state, and a set sloped pulse current to program the memory cells selected by the address circuit into the crystalline state; and
varying at least one of a pulse width and a pulse slope of at least one of the reset and set sloped pulse currents according to a load between the writer driver and the memory cells being programmed,
wherein the pulse width of the reset sloped pulse current is constant, and wherein a pulse width of the set sloped pulse current is increased or decreased with an increase in load between the writer driver and the memory cells selected by the address circuit.

18. A phase-change cell memory device, comprising:
a plurality of phase-change memory cells each including a volume of material programmable between amorphous and crystalline states;
an address circuit for selecting at least one of the memory cells;
a write driver for generating a reset pulse current to program a memory cell selected by the address circuit into the amorphous state, and generating a set pulse current to program the memory cell selected by the address circuit into the crystalline state; and
a write driver control circuit coupled to the address circuit, the write driver control circuit for varying at least one of the reset and set pulse currents according to a load of word line of the memory cell selected by the address circuit,
wherein the write driver control circuit constantly preserves the reset pulse current and varies any one of a pulse width, a pulse level and the number of pulses in the set pulse current.

19. A phase-change cell memory device, comprising:
a plurality of phase-change memory cells each including a volume of material programmable between amorphous and crystalline states;
an address circuit for selecting at least one of the memory cells;
a write driver for generating a reset pulse current to program a memory cell selected by the address circuit into the amorphous state, and generating a set pulse current to program the memory cell selected by the address circuit into the crystalline state; and
a write driver control circuit coupled to the address circuit, the write driver control circuit for varying at least one of the reset and set pulse currents according to a load of word line of the memory cell selected by the address circuit,
wherein the write driver control circuit constantly preserves the reset pulse current, and varies any one of a slope pulse width and a slope pulse level of the set pulse current.

20. A phase-change cell memory device, comprising:
a plurality of phase-change memory cells each including a volume of material programmable between amorphous and crystalline states;
an address circuit for selecting at least one of the memory cells;
a write driver for generating a reset pulse current to program a memory cell selected by the address circuit into the amorphous state, and generating a set pulse current to program the memory cell selected by the address circuit into the crystalline state; and
a write driver control circuit coupled to the address circuit, the write driver control circuit for varying at least one of the reset and set pulse currents according to a load of word line of the memory cell selected by the address circuit
wherein the write driver control circuit constantly preserves the set pulse current, and varies any one of a pulse width, a pulse level and the number of pulses in the reset pulse current.

21. A phase-change cell memory device, comprising:
a plurality of phase-change memory cells each including a volume of material programmable between amorphous and crystalline states;
an address circuit for selecting at least one of the memory cells;
a write driver for generating a reset pulse current to program a memory cell selected by the address circuit into the amorphous state, and generating a set pulse current to program the memory cell selected by the address circuit into the crystalline state; and
a write driver control circuit coupled to the address circuit, the write driver control circuit for varying at least one of the reset and set pulse currents according to a load of word line of the memory cell selected by the address circuit
wherein the write driver control circuit constantly preserves the set pulse current, and varies any one of a slope pulse width and a slope pulse level of the reset pulse current.

22. The device of claim 18, wherein the pulse width or pulse number of the reset pulse current is constant, and the write driver control circuit reduces the pulse width or pulse number of the set pulse current according to a word line load increase of the memory cells coupled to the same word line.

23. The device of claim 18, wherein a unit memory cell of the phase-change memory cells includes one variable resistance formed of phase-change material, and a diode connected between the variable resistance and a word line.

24. A phase-change cell memory device, comprising:
a plurality of memory cell blocks each including a plurality of phase-change memory cells, each of the phase-change memory cells having a volume of material programmable between amorphous and crystalline states;
an address circuit for selecting each of the memory cell blocks;

a write driver for selectively generating a reset pulse current to program memory cells of a memory cell block selected by the address circuit into the amorphous set state, and a set pulse current to program memory cells of the memory cell block selected by the address circuit into the crystalline state; and a write driver control circuit for varying a pulse width, pulse level, pulse number or pulse slope of at least one of the reset and set pulse currents according to a load of word line of the memory cell block selected by the address circuit.

* * * * *